US012204997B2

(12) United States Patent
Reagor et al.

(10) Patent No.: US 12,204,997 B2
(45) Date of Patent: Jan. 21, 2025

(54) PHOTONIC QUANTUM NETWORKING FOR LARGE SUPERCONDUCTING QUBIT MODULES

(71) Applicants: President and Fellows of Harvard College, Cambridge, MA (US); Rigetti & Co, LLC, Berkeley, CA (US)

(72) Inventors: Matthew J. Reagor, San Rafael, CA (US); Jeffrey Cole Holzgrafe, Somerville, MA (US); Marko Lončar, Belmont, MA (US)

(73) Assignees: Rigetti & Co, LLC, Berkeley, CA (US); President and Fellows of Harvard College, Cambridge, MA (US)

( * ) Notice: Subject to any disclaimer, the term of this patent is extended or adjusted under 35 U.S.C. 154(b) by 449 days.

(21) Appl. No.: 17/686,906

(22) Filed: Mar. 4, 2022

(65) Prior Publication Data
US 2022/0222567 A1 Jul. 14, 2022

Related U.S. Application Data

(63) Continuation of application No. PCT/US2021/054730, filed on Oct. 13, 2021.
(Continued)

(51) Int. Cl.
*G06N 10/40* (2022.01)
*G01B 9/02015* (2022.01)
*H10N 60/20* (2023.01)

(52) U.S. Cl.
CPC ........... *G06N 10/40* (2022.01); *G01B 9/0203* (2013.01); *H10N 60/20* (2023.02)

(58) Field of Classification Search
CPC ...... G06N 10/40; G01B 9/0203; H10N 60/20; B82Y 10/00
See application file for complete search history.

(56) References Cited

U.S. PATENT DOCUMENTS 10,483,980 B2   11/2019   Sete et al.
10,782,590 B2   9/2020    Witmer et al.
(Continued)

OTHER PUBLICATIONS

KIPO, International Search Report and Written Opinion mailed Jan. 26, 2022, in PCT/US2021/054730, 9 pgs.
(Continued)

*Primary Examiner* — Nghia M Doan
(74) *Attorney, Agent, or Firm* — Henry Patent Law Firm PLLC

(57) ABSTRACT

In a general aspect, a photonic quantum network is disclosed. In some implementations, microwave modes and optical modes are generated on first and second quantum processing units (QPUs) by operation of a first transducer device of the first QPU and a second transducer device of the second QPU. The microwave modes are transmitted within the first and second QPUs from the first and second transducer devices to respective first and second qubit devices. The optical modes are transmitted from the first and second QPUs to an interferometer device. By operation of the interferometer device, output signals are generated on respective output channels based on the optical modes from the first and second QPUs. Based on the output signals detected by operation of photodetector devices coupled to the respective output channels, quantum entanglement transferred to the first and second qubit devices by the microwave modes is identified.

22 Claims, 15 Drawing Sheets

Related U.S. Application Data

(60) Provisional application No. 63/128,536, filed on Dec. 21, 2020, provisional application No. 63/090,966, filed on Oct. 13, 2020.

(56) References Cited

U.S. PATENT DOCUMENTS

| | | |
|---|---|---|
| 2014/0314419 A1 | 10/2014 | Paik |
| 2017/0213144 A1 | 7/2017 | Mirkamali et al. |
| 2018/0260730 A1* | 9/2018 | Reagor .................. G06F 15/76 |
| 2021/0271999 A1* | 9/2021 | Paik ....................... G06N 10/00 |

OTHER PUBLICATIONS

Awschalom , et al., "Development of Quantum InterConnects (QuICs) for Next-Generation Information Technologies", arXiv:1912_06642v2, Jan. 2, 2020, 31 pgs.
Britt , et al., "High-Performance Computing with Quantum Processing Units", ACM Journal on Emerging Technologies in Computing Systems, Feb. 2017, 13 pgs.
Caldwell , et al., "Parametrically Activated Entangling Gates Using Transmon Qubits", Physical Review Applied 10, 034050, Sep. 24, 2018, 8 pgs.
Campbell , et al., "Measurement-Based Entanglement under Conditions of Extreme Photon Loss", Phys.Rev.Lett. 101, 130502, Sep. 26, 2008, 4 pgs.
Cirac , et al., "Quantum State Transfer and Entanglement Distribution among Distant Nodes in a Quantum Network", Phys.Rev.Lett. 78, 16, Apr. 21, 1997, 4 pgs.
Fernandez-Gonzalvo , et al., "Coherent frequency up-conversion of microwaves to the optical telecommunications band in an Er:YSO crystal", Phys.Rev.A 92, Dec. 8, 2015, 7 pgs.
Fowler , et al., Surface Codes: Towards Practical Large-Scale Quantum Computation, Physical Review A 86, 032324; American Physical Society; Ridge, NY; US, Sep. 18, 2012, 48 pgs.
Fowler , et al., "Surface Code Quantum Communication", Phys. Rev.Lett. 104, May 6, 2010, 4 pgs.
Han , et al., "Coherent Microwave-to-Optical Conversion via Six-Wave Mixing in Rydberg Atoms", Phys.Rev.Lett. 120, Mar. 1, 2018, 6 pgs.
Hease , et al., "Cavity quantum electro-optics: Microwave-telecom conversion in the quantum ground state", arXiv:2005.12763v1, May 26, 2020, 16 pgs.
Higginbotham , et al., "Harnessing electro-optic correlations in an efficient mechanical converter", nature physics, 14, Oct. 2018, 6 pgs.
Hisatomi , et al., "Bidirectional conversion between microwave and light via ferromagnetic magnons", Phys.Rev.B 93, May 27, 2016, 13 pgs.
Holzgrafe , et al., "Cavity electro-optics in thin-film lithium niobate for efficient microwave-to-optical transduction", arXiv:2005.00939v2, May 12, 2020, 19 pgs.
Horsman , et al., "Surface code quantum computing by lattice surgery", New Journal of Physics 14, Dec. 7, 2012, 27 pgs.
Kalb , et al., "Entanglement distillation between solid-state quantum network nodes", Science 356, Jun. 2, 2017, 5 pgs.
Krastanov , et al., "Optically-Heralded Entanglement of Superconducting Systems in Quantum Networks", arXiv:2012.13408v3, Sep. 7, 2021, 10 pgs.
Krastanov , et al., "Optmized Entanglement Purification", arXiv:1712.09762v3, Feb. 14, 2019, 18 pgs.
Kurpiers , et al., "Deterministic quantum state transfer and remote entanglement using microwave photons", Nature 558, Jun. 14, 2018, 17 pgs.
Li , et al., "Hierarchical surface code for network quantum computing with modules of arbitrary size", Phys.Rev.A 94, 042303, Oct. 4, 2016, 12 pgs.
Litinski , "A Game of Surface Codes: Large-Scale Quantum Computing with Lattice Surgery", Quantum 3, 128, 2019.
Magnard , et al., "Microwave Quantum Link between Superconducting Circuits Housed in Spatially Separated Cryogenic Systems", arXiv: 2008.01642v1, Aug. 4, 2020, 13 pgs.
McKenna , et al., "Cryogenic microwave-to-optical conversion using a triply-resonant litium niobate on sapphire transducer", May 2, 2020, 15 pgs.
Mirhosseini , et al., "Quantum transduction of optical photons from a superconducting qubit", arXiv:2004.04838v1, Apr. 9, 2020, 17 pgs.
Monroe, C. , et al., "Large-scale modular quantum-computer architecture with atomic memory and photonic Interconnects", Phys Rev. A, 89 022317, 2014, 16 pgs.
Nickerson , et al., "Freely Scalable Quantum Technologies Using Cells of 5-to-50 Qubits with Very Lossy and Noisy Photonic Links", Phys. Rev. X 4, 041041, Dec. 9, 2014, 17 pgs.
Riedinger , et al., "Non-classical correlations between single photons and phonons from a mechanical oscillator", arXiv:1512.05360v2, Feb. 23, 2016, 12 pgs.
Rueda , et al., "Efficient microwave to optical photon conversion: an electro-optical realization", Optica 3, 597, Jun. 2016, 8 pgs.
Safavi-Naeini , et al., "Proposal for an optomechanical traveling wave phonon-photon translator", New Journal of Physics 13, Jan. 13, 2011, 30 pgs.
Scheer , et al., "Computational modeling of decay and hybridization in superconducting circuits", arXiv:1810.11510v1, Oct. 26, 2018, 11 pgs.
Shapiro , "The Quantum Illumination Story", Dec. 23, 2019, 14 pgs.
Wenner , et al., "Catching Time-Reversed Microwave Photons with a 99.4% Absorption Efficiency", arXiv:1311.1180, Nov. 16, 2013, 16 pgs.
Zhang , et al., "Monolithic ultra-high-Q lithium niobate microring resonator", Optica 4, 1536, Dec. 18, 2017, 2 pgs.
Zhong , et al., "Entanglement of Microwave-Optical Modes in a Strongly Coupled Electro-Optomechanical System", arXiv:2001.06107v1, Jan. 16, 2020, 10 pgs.
Campagne-Ibarcq , "Deterministic Remote Entanglement of Superconducting Circuits through Microwave Two-Photon Transitions", Phys.Rev.Lett. 120, 200501, May 16, 2018, 6 pgs.
Duan , et al., "Long-distance quantum communication with atomic ensembles and linear optics", Nature 414, Nov. 22, 2001, 6 pgs.
Fu , et al., "Ground-state Pulsed Cavity Electro-optics for Microwave-to-optical Conversion", arXiv:2010.11392v1, Oct. 22, 2020, 8 pgs.
Gidney , et al., "How to factor 2048 bit RSA integers in 8 hours using 20 million noisy qubits", arXiv:1905.09749v2, Dec. 5, 2019, 26 pgs.
Kreikebaum , et al., "Optimization of infrared and magnetic shielding of superconducting TIN and AI coplanar microwave resonators", Supercond. Sci. Technol. 29 104002, Aug. 12, 2016, 4 pgs.
Mobassem , et al., "Thermal Noise in Electro-Optic Devices at Cryogenic Temperatures", arXiv:2008.08764v1, Aug. 20, 2020, 12 pgs.
Singh , et al., "The CUORE cryostat: commissioning and performance", Journal of Physics: Conference Series 718 062054, 2016, 5 pgs.
Zhang , et al., "Electronically programmable photonic molecule", Nature Photonics 13, Jan. 2019, 6 pgs.
EPO, Extended European Search Report issued in Application No. 21880973.9 on Oct. 17, 2024, 11 pages.
Kumar, Sourabh , et al., "Towards long-distance quantum networks with superconducting processors and optical links", arXiv: 1812.08634v2, Aug. 11, 2019, 23 pages.
Neuman, Tomas , et al., "A Phononic Bus for Coherent Interfaces Between a Superconducting Quantum Processor, Spin Memory, and Photonic Quantum Networks", arXiv:2003.08383v1, Mar. 18, 2020, 17 pages.
Zhong, Changchun , et al., "Heralded Generation and Detection of Entangled Microwave-Optical Photon Pairs", arXiv:1901.08228v1, Jan. 24, 2019, 13 pages.

* cited by examiner

| | |
|---|---|
| Optical linewidth | 100 MHz |
| Microwave linewidth | 10 MHz |
| Repetition rate | 1 MHz |
| Average optical power | 2 µW |
| Pair probability | 0.02 |
| Optical loss | 6 dB |
| Entanglement rate | 4 kHz |

| | Optical $Q_i$ | $g_0$ (kHz) | R (MHz) | $\eta_{opt}$ (dB) | Avg. pump (uW) | $R_{enf}$ (kHz) |
|---|---|---|---|---|---|---|
| Gen I | $10^6$ | 0.5 | 1 | -28 | 2.5 | $10^{-5}$ |
| Gen II | $10^7$ | 1.5 | 1 | -6 | 2.5 | 7.5 |

FIG. 7A

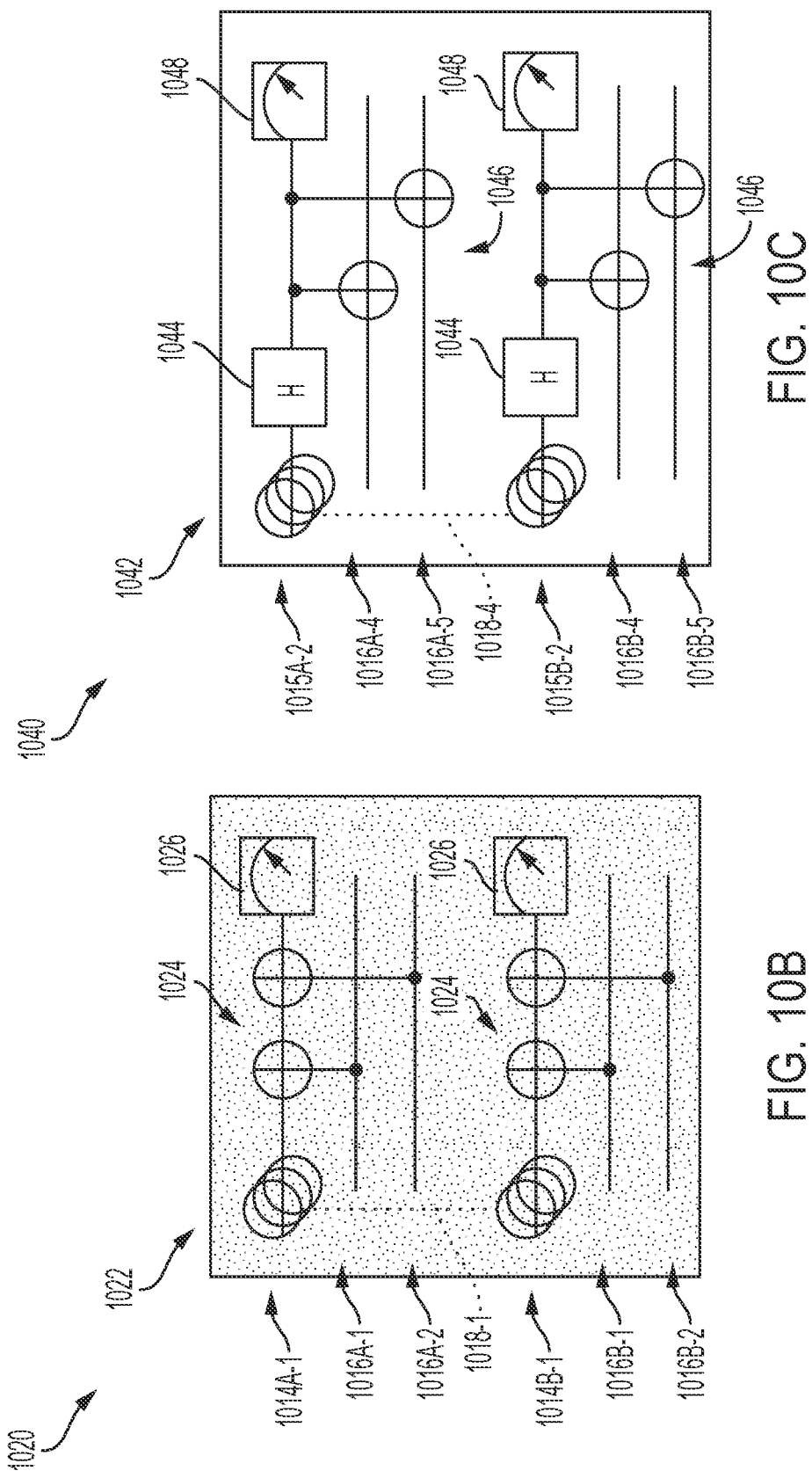

PHOTONIC QUANTUM NETWORKING FOR LARGE SUPERCONDUCTING QUBIT MODULES

CROSS-REFERENCE TO RELATED APPLICATIONS

This application is a continuation of PCT/US2021/054730, filed Oct. 13, 2021, and entitled "Photonic Quantum Networking for Large Superconducting Qubit Modules," which claims priority to U.S. Provisional Application No. 63/090,966 filed on Oct. 13, 2020, and entitled "Photonic Quantum Networking for Large Superconducting Qubit Modules," and U.S. Provisional Application No. 63/128,536 filed on Dec. 21, 2020, and entitled "Photonic Quantum Networking for Large Superconducting Qubit Modules." The above-referenced priority applications are hereby incorporated by reference.

GOVERNMENT SUPPORT

This invention was made with government support under Contract No. FA8750-20-P-1716 awarded by the Air Force Research Laboratory. The government has certain rights in the invention.

BACKGROUND

The following description relates to quantum processing units with logical qubit hardware modules.

Quantum computers can perform computational tasks by storing and processing information within quantum states of quantum systems. For example, qubits (i.e., quantum bits) can be stored in, and represented by, an effective two-level sub-manifold of a quantum coherent physical system. A variety of physical systems have been proposed for quantum computing applications. Examples include superconducting circuits, trapped ions, spin systems, and others.

BRIEF DESCRIPTION OF THE DRAWINGS

FIG. 4 is a table showing parameters of an example transducer device.

FIG. 7A is a table showing quantum entanglement generation rates generated by operation of two example types of transducer devices.

FIGS. 10B-10C are schematic diagrams showing aspects of example quantum logic circuits for performing a ZZZZ parity measurement and a XXXX parity measurement with a remote Bell pair of entangled qubits.

DETAILED DESCRIPTION

Figure 1:
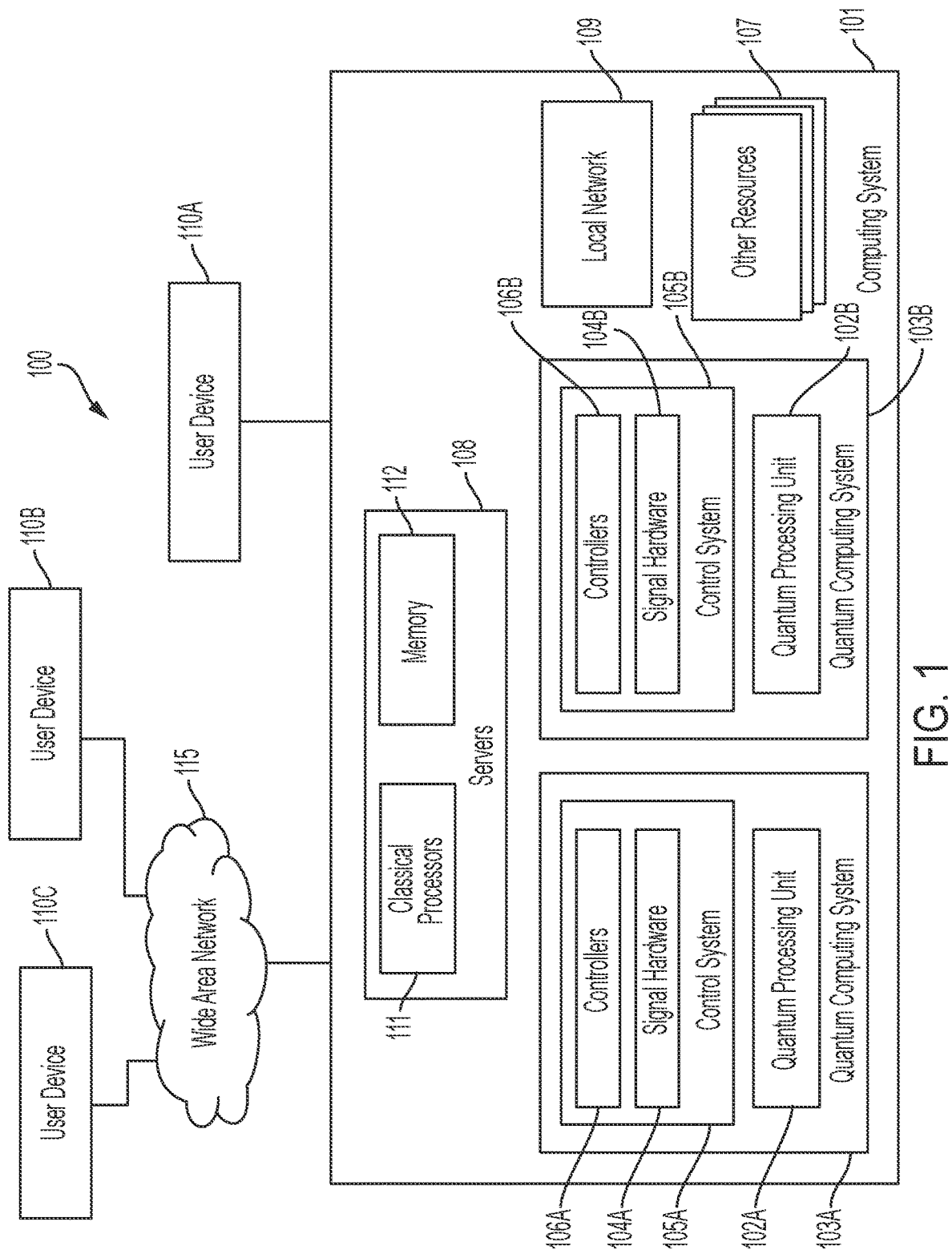
FIG. 1 is a block diagram of an example computing environment.

In some aspects of what is described here, quantum computing systems based on superconducting quantum processing units are networked across a photonic communication system (e.g., an optical intranet) to form a quantum computing network for distributed quantum computation and long-distance quantum communication. In some implementations, quantum computing systems, for example in quantum data centers, are communicably coupled through an optical intranet in an end-to-end architecture. Each of the quantum computing systems includes one or more quantum processing units. In some instances, each of the quantum processing units is a modular quantum processing unit including multiple quantum processor modules. In this case, quantum processor modules in different quantum computing systems can be communicably coupled via the optical intranet.

In some implementations, each of the quantum processing units includes multiple qubit devices and possibly other quantum circuit devices. By networking multiple qubit devices, for example, in a quantum processor module, a logical qubit can be defined. When the multiple qubit devices are networked in an error correcting pattern, the logical qubit defined by the multiple qubit devices can be sustained by an error correction mechanism. In some implementations, the qubit devices include superconducting qubit devices and other solid-state qubit devices, e.g., spin qubit devices. In some implementations, the qubit devices can be used for performing quantum operations, for performing quantum entanglement distillation, for storing quantum entanglement, (e.g., by logical qubits), or other operations.

In some implementations, each of the quantum processing units includes a direct electro-optic transducer device based on a thin-film lithium niobate resonator device. During the creation of remote quantum entanglement between two qubit devices in two respective quantum processing units, two transducer devices in the two respective quantum processing units receive respective optical excitations, and generate respective microwave modes and optical modes. The microwave modes are transmitted within the respective quantum processing units to, and captured by, the two respective qubit devices. In response to a successful detection of the optical modes that are transmitted out of the respective quantum processing units and within the photonic communication system, quantum entanglement transmitted by the microwave modes to the two respective qubit devices, e.g., a remote Bell pair of entangled states, can be identified. In some implementations, a remote Bell pair of entangled states is stored and distilled in local error corrected logical qubits for subsequent processing.

In some implementations, the systems and techniques described here can provide technical advantages and improvements. For example, the transduction scheme is mechanically and thermally stable (e.g. does not rely on freestanding structures), broadband (for strong electro-optic coefficients), scalable, and tunable (e.g. using bias voltages). The methods and systems presented here can improve entanglement generation rates and enable operations at increased bandwidth and reduced noise. For example, the methods and systems presented can link superconducting qubit devices operating at a microwave frequency regime (e.g., a few GHz frequencies) in superconducting quantum processing units with a photonic quantum computing network operating at an optical frequency regime (e.g., at hundreds of THz frequencies) without introducing noise. The link created by the methods and systems presented here is quantum-coherent. For another example, the methods and systems presented here can generate remote pairs of entangled states with high fidelity. The methods and systems presented allow for large-scale superconducting quantum processing units to communicate over a photonic communication network without perfect memories. In some cases, a combination of these and potentially other advantages and improvements may be obtained.

FIG. 1 is a block diagram of an example computing environment 100. The example computing environment 100 shown in FIG. 1 includes a computing system 101 and user devices 110A, 110B, 110C. A computing environment may include additional or different features, and the components of a computing environment may operate as described with respect to FIG. 1 or in another manner.

The example computing system 101 includes classical and quantum computing resources and exposes their functionality to the user devices 110A, 110B, 110C (referred to collectively as "user devices 110"). The computing system 101 shown in FIG. 1 includes one or more servers 108, quantum computing systems 103A, 103B, a local network 109, and other resources 107. The computing system 101 may also include one or more user devices (e.g., the user device 110A) as well as other features and components. A computing system may include additional or different features, and the components of a computing system may operate as described with respect to FIG. 1 or in another manner.

The example computing system 101 can provide services to the user devices 110, for example, as a cloud-based or remote-accessed computer system, as a distributed computing resource, as a supercomputer or another type of high-performance computing resource, or in another manner. The computing system 101 or the user devices 110 may also have access to one or more other quantum computing systems (e.g., quantum computing resources that are accessible through the wide area network 115, the local network 109, or otherwise).

The user devices 110 shown in FIG. 1 may include one or more classical processors, memory, user interfaces, communication interfaces, and other components. For instance, the user devices 110 may be implemented as laptop computers, desktop computers, smartphones, tablets, or other types of computer devices. In the example shown in FIG. 1, to access computing resources of the computing system 101, the user devices 110 send information (e.g., programs, instructions, commands, requests, input data, etc.) to the servers 108; and in response, the user devices 110 receive information (e.g., application data, output data, prompts, alerts, notifications, results, etc.) from the servers 108. The user devices 110 may access services of the computing system 101 in another manner, and the computing system 101 may expose computing resources in another manner.

In the example shown in FIG. 1, the local user device 110A operates in a local environment with the servers 108 and other elements of the computing system 101. For instance, the user device 110A may be co-located with (e.g., located within 0.5 to 1 km of) the servers 108 and possibly other elements of the computing system 101. As shown in FIG. 1, the user device 110A communicates with the servers 108 through a local data connection.

The local data connection in FIG. 1 is provided by the local network 109. For example, some or all of the servers 108, the user device 110A, the quantum computing systems 103A, 103B, and the other resources 107 may communicate with each other through the local network 109. In some implementations, the local network 109 operates as a communication channel that provides one or more low-latency communication pathways from the server 108 to the quantum computing systems 103A, 103B (or to one or more of the elements of the quantum computing systems 103A, 103B). The local network 109 can be implemented, for instance, as a wired or wireless Local Area Network, an Ethernet connection, or another type of wired or wireless connection. The local network 109 may include one or more wired or wireless routers, wireless access points (WAPs), wireless mesh nodes, switches, high-speed cables, or a combination of these and other types of local network hardware elements. In some cases, the local network 109 includes a software-defined network that provides communication among virtual resources, for example, among an array of virtual machines operating on the server 108 and possibly elsewhere.

In the example shown in FIG. 1, the remote user devices 110B, 110C operate remote from the servers 108 and other elements of the computing system 101. For instance, the user devices 110B, 110C may be located at a remote distance (e.g., more than 1 km, 10 km, 100 km, 1,000 km, 10,000 km, or farther) from the servers 108 and possibly other elements of the computing system 101. As shown in FIG. 1, each of the user devices 110B, 110C communicates with the servers 108 through a remote data connection.

The remote data connection in FIG. 1 is provided by a wide area network 115, which may include, for example, the Internet or another type of wide area communication network. In some cases, remote user devices use another type of remote data connection (e.g., satellite-based connections, a cellular network, a virtual private network, etc.) to access the servers 108. The wide area network 115 may include one or more internet servers, firewalls, service hubs, base stations, or a combination of these and other types of remote networking elements. Generally, the computing environment 100 can be accessible to any number of remote user devices.

The example servers 108 shown in FIG. 1 can manage interaction with the user devices 110 and utilization of the quantum and classical computing resources in the computing system 101. For example, based on information from the user devices 110, the servers 108 may delegate computational tasks to the quantum computing systems 103A, 103B and the other resources 107; the servers 108 can then send information to the user devices 110 based on output data from the computational tasks performed by the quantum computing systems 103A, 103B, and the other resources 107.

As shown in FIG. 1, the servers 108 are classical computing resources that include classical processors 111 and memory 112. The servers 108 may also include one or more communication interfaces that allow the servers to communicate via the local network 109, the wide area network 115, and possibly other channels. In some implementations, the servers 108 may include a host server, an application server, a virtual server, or a combination of these and other types of servers. The servers 108 may include additional or different features, and may operate as described with respect to FIG. 1 or in another manner.

The classical processors 111 can include various kinds of apparatus, devices, and machines for processing data, including, by way of example, a microprocessor, a central processing unit (CPU), a graphics processing unit (GPU), an FPGA (field programmable gate array), an ASIC (application specific integrated circuit), or combinations of these. The memory 112 can include, for example, a random-access memory (RAM), a storage device (e.g., a writable read-only memory (ROM) or others), a hard disk, or another type of storage medium. The memory 112 can include various forms of volatile or non-volatile memory, media, and memory devices, etc.

Each of the example quantum computing systems 103A, 103B operates as a quantum computing resource in the computing system 101. The other resources 107 may include additional quantum computing resources (e.g., quantum computing systems, quantum simulators, or both) as well as classical (non-quantum) computing resources such as, for example, digital microprocessors, specialized co-processor units (e.g., graphics processing units (GPUs), cryptographic co-processors, etc.), special purpose logic circuitry (e.g., field programmable gate arrays (FPGAs), application-specific integrated circuits (ASICs), etc.), systems-on-chips (SoCs), etc., or combinations of these and other types of computing modules.

In some implementations, the servers 108 generate programs, identify appropriate computing resources (e.g., a QPU or QVM) in the computing system 101 to execute the programs, and send the programs to the identified resources for execution. For example, the servers 108 may send programs to the quantum computing system 103A, the quantum computing system 103B, or any of the other resources 107. The programs may include classical programs, quantum programs, hybrid classical/quantum programs, and may include any type of function, code, data, instruction set, etc.

In some instances, programs can be formatted as source code that can be rendered in human-readable form (e.g., as text) and can be compiled, for example, by a compiler running on the servers 108, on the quantum computing systems 103, or elsewhere. In some instances, programs can be formatted as compiled code, such as, for example, binary code (e.g., machine-level instructions) that can be executed directly by a computing resource. Each program may include instructions corresponding to computational tasks that, when performed by an appropriate computing resource, generate output data based on input data. For example, a program can include instructions formatted for a quantum computer system, a simulator, a digital microprocessor, co-processor or other classical data processing apparatus, or another type of computing resource.

In some cases, a program may be expressed in a hardware-independent format. For example, quantum machine instructions may be provided in a quantum instruction language such as Quil, described in the publication "A Practical Quantum Instruction Set Architecture," arXiv: 1608.03355v2, dated Feb. 17, 2017, or another quantum instruction language. For instance, the quantum machine instructions may be written in a format that can be executed by a broad range of quantum processing units or simulators. In some cases, a program may be expressed in high-level terms of quantum logic gates or quantum algorithms, in lower-level terms of fundamental qubit rotations and controlled rotations, or in another form. In some cases, a program may be expressed in terms of control signals (e.g., pulse sequences, delays, etc.) and parameters for the control signals (e.g., frequencies, phases, durations, channels, etc.). In some cases, a program may be expressed in another form or format. In some cases, a program may utilize Quil-T, described in the publication "Gain deeper control of Rigetti quantum processing units with Quil-T," available at https://medium.com/rigetti/gain-deeper-control-of-rigetti-quantum-processors-with-quil-t-ea8945061e5b dated Dec. 10, 2020, which is hereby incorporated by reference in the present disclosure.

In some implementations, the servers 108 include one or more compilers that convert programs between formats. For example, the servers 108 may include a compiler that converts hardware-independent instructions to binary programs for execution by the quantum computing systems 103A, 103B. In some cases, a compiler can compile a program to a format that targets a specific quantum resource in the computer system 101. For example, a compiler may generate a different binary program (e.g., from the same source code) depending on whether the program is to be executed by the quantum computing system 103A or the quantum computing system 103B.

In some cases, a compiler generates a partial binary program that can be updated, for example, based on specific parameters. For instance, if a quantum program is to be executed iteratively on a quantum computing system with varying parameters on each iteration, the compiler may generate the binary program in a format that can be updated with specific parameter values at runtime (e.g., based on feedback from a prior iteration, or otherwise); the parametric update can be performed without further compilation. In some cases, a compiler generates a full binary program that does not need to be updated or otherwise modified for execution.

In some implementations, the servers 108 generate a schedule for executing programs, allocate computing resources in the computing system 101 according to the schedule, and delegate the programs to the allocated computing resources. The servers 108 can receive, from each computing resource, output data from the execution of each program. Based on the output data, the servers 108 may generate additional programs that are then added to the schedule, output data that is provided back to a user device 110, or perform another type of action.

In some implementations, all or part of the computing environment operates as a cloud-based quantum computing (QC) environment, and the servers 108 operate as a host system for the cloud-based QC environment. The cloud-based QC environment may include software elements that operate on both the user devices 110 and the computer system 101 and interact with each other over the wide area network 115. For example, the cloud-based QC environment may provide a remote user interface, for example, through a browser or another type of application on the user devices 110. The remote user interface may include, for example, a graphical user interface or another type of user interface that obtains input provided by a user of the cloud-based QC environment. In some cases the remote user interface includes, or has access to, one or more application programming interfaces (APIs), command line interfaces, graphical user interfaces, or other elements that expose the services of the computer system 101 to the user devices 110.

In some cases, the cloud-based QC environment may be deployed in a "serverless" computing architecture. For instance, the cloud-based QC environment may provide on-demand access to a shared pool of configurable computing resources (e.g., networks, servers, storage, applications, services, quantum computing resources, classical computing resources, etc.) that can be provisioned for requests from user devices 110. Moreover, the cloud-based computing systems 101 may include or utilize other types of computing resources, such as, for example, edge computing, fog computing, etc.

In an example implementation of a cloud-based QC environment, the servers 108 may operate as a cloud provider that dynamically manages the allocation and provisioning of physical computing resources (e.g., GPUs, CPUs, QPUs, etc.). Accordingly, the servers 108 may provide services by defining virtualized resources for each user account. For instance, the virtualized resources may be formatted as virtual machine images, virtual machines, containers, or virtualized resources that can be provisioned for a user account and configured by a user. In some cases, servers 108 include a container management and execution system that is implemented, for example, using KUBERNETES® or another software platform for container management. In some cases, the cloud-based QC environment is implemented using a resource such as, for example, OPENSTACK®. OPENSTACK® is an example of a software platform for cloud-based computing, which can be used to provide virtual servers and other virtual computing resources for users.

In some cases, the server 108 stores quantum machine images (QMI) for each user account. A quantum machine image may operate as a virtual computing resource for users of the cloud-based QC environment. For example, a QMI can provide a virtualized development and execution environment to develop and run programs (e.g., quantum programs or hybrid classical/quantum programs). When a QMI operates on the server 108, the QMI may engage either of the quantum processing units 102A, 102B, and interact with a remote user device (110B or 110C) to provide a user programming environment. The QMI may operate in close physical proximity to, and have a low-latency communication link with, the quantum computing systems 103A, 103B. In some implementations, remote user devices connect with QMIs operating on the servers 108 through secure shell (SSH) or other protocols over the wide area network 115.

In some implementations, all or part of the computing system 101 operates as a hybrid computing environment. For example, quantum programs can be formatted as hybrid classical/quantum programs that include instructions for execution by one or more quantum computing resources and instructions for execution by one or more classical resources. The servers 108 can allocate quantum and classical computing resources in the hybrid computing environment, and delegate programs to the allocated computing resources for execution. The quantum computing resources in the hybrid environment may include, for example, one or more quantum processing units (QPUs), one or more quantum virtual machines (QVMs), one or more quantum simulators, or possibly other types of quantum resources. The classical computing resources in the hybrid environment may include, for example, one or more digital microprocessors, one or more specialized co-processor units (e.g., graphics processing units (GPUs), cryptographic co-processors, etc.), special purpose logic circuitry (e.g., field programmable gate arrays (FPGAs), application-specific integrated circuits (ASICs), etc.), systems-on-chips (SoCs), or other types of computing modules.

In some cases, the servers 108 can select the type of computing resource (e.g., quantum or classical) to execute an individual program, or part of a program, in the computing system 101. For example, the servers 108 may select a particular quantum processing unit (QPU) or other computing resource based on availability of the resource, speed of the resource, information or state capacity of the resource, a performance metric (e.g., process fidelity) of the resource, or based on a combination of these and other factors. In some cases, the servers 108 can perform load balancing, resource testing and calibration, and other types of operations to improve or optimize computing performance.

Each of the example quantum computing systems 103A, 103B shown in FIG. 1 can perform quantum computational tasks by executing quantum machine instructions (e.g., a binary program compiled for the quantum computing system). In some implementations, a quantum computing system can perform quantum computation by storing and manipulating information within quantum states of a composite quantum system. For example, qubits (i.e., quantum bits) can be stored in, and represented by, an effective two-level sub-manifold of a quantum coherent physical system. In some instances, quantum logic can be executed in a manner that allows large-scale entanglement within the quantum system. Control signals can manipulate the quantum states of individual qubits and the joint states of multiple qubits. In some instances, information can be read out from the composite quantum system by measuring the quantum states of the qubits. In some implementations, the quantum states of the qubits are read out by measuring the transmitted or reflected signal from auxiliary quantum devices that are coupled to individual qubits.

In some implementations, a quantum computing system can operate using gate-based models for quantum computing. For example, the qubits can be initialized in an initial state, and a quantum logic circuit comprised of a series of quantum logic gates can be applied to transform the qubits and extract measurements representing the output of the quantum computation. Individual qubits may be controlled by single-qubit quantum logic gates, and pairs of qubits may be controlled by two-qubit quantum logic gates (e.g., entangling gates that are capable of generating entanglement between the pair of qubits). In some implementations, a quantum computing system can operate using adiabatic or annealing models for quantum computing. For instance, the qubits can be initialized in an initial state, and the controlling Hamiltonian can be transformed adiabatically by adjusting control parameters to another state that can be measured to obtain an output of the quantum computation.

In some models, fault-tolerance can be achieved by applying a set of high-fidelity control and measurement operations to the qubits. For example, quantum error correcting schemes can be deployed to achieve fault-tolerant quantum computation. Other computational regimes may be used; for example, quantum computing systems may operate in non-fault-tolerant regimes. In some implementations, a quantum computing system is constructed and operated according to a scalable quantum computing architecture. For example, in some cases, the architecture can be scaled to a large number of qubits to achieve large-scale general purpose coherent quantum computing. Other architectures may be used; for example, quantum computing systems may operate in small-scale or non-scalable architectures.

The example quantum computing system 103A shown in FIG. 1 includes a quantum processing unit 102A and a control system 105A, which controls the operation of the quantum processing unit 102A. Similarly, the example quantum computing system 103B includes a quantum processing unit 102B and a control system 105B, which controls the operation of a quantum processing unit 102B. A quantum computing system may include additional or different features, and the components of a quantum computing system may operate as described with respect to FIG. 1 or in another manner.

In some instances, all or part of the quantum processing unit 102A functions as a quantum processing unit, a quantum memory, or another type of subsystem. In some examples, the quantum processing unit 102A includes a quantum circuit system. The quantum circuit system may include qubit devices, readout devices, and possibly other devices that are used to store and process quantum information. In some cases, the quantum processing unit 102A includes a superconducting circuit, and the superconducting circuit includes qubit devices operatively coupled to each other by coupler devices. In certain examples, the qubit devices and the coupler devices are implemented as superconducting quantum circuit devices that include Josephson junctions, for example, in Superconducting QUantum Interference Device (SQUID) loops or other arrangements, and are controlled by radio-frequency signals, microwave signals, and bias signals delivered to the quantum processing unit 102A.

In some implementations, quantum processing units 102 in distributed quantum computing systems 103 are communicably coupled together using a photonic communication network to form a quantum computing network. In this case, remote quantum entanglement can be created between qubit devices from the different quantum processing units 102 in the distributed quantum computing systems 103. In some implementations, each of the quantum processing units 102 includes a transducer device and a superconducting quantum circuit (e.g., qubit devices and other quantum circuit devices). In some implementations, each of the transducer devices is configured to receive an optical excitation from an external source (e.g., the pump laser system 504 of the global controller system 508 in FIG. 8) via the photonic communication network (e.g., the optical fibers that carry the first and second optical excitations 534A, 534B) and to generate optical and microwave modes that contains entangled optical-microwave photon pairs. In some implementations, the optical modes are transmitted out of the respective quantum processing units 102, e.g., from the transducer devices, for example to the global controller system 508 of FIG. 5, via the photonic communication network; and the microwave modes are transmitted within the respective quantum processing units 102 from the transducer devices, e.g., to the qubit devices in the superconducting quantum circuits. In this case, a remote pair of entangled microwave states can be created, transmitted by the microwave modes to the qubit devices, and applied on qubits defined by the qubit devices for further processing (e.g., quantum entanglement distillation or other types of quantum operations). In some instances, a quantum processing unit 102 may be implemented as the quantum processing unit 210, 300, 502 in FIGS. 2, 3, and 5, or in another manner.

The quantum processing unit 102A may include, or may be deployed within, a controlled environment. The controlled environment can be provided, for example, by shielding equipment, cryogenic equipment, and other types of environmental control systems. In some examples, the components in the quantum processing unit 102A operate in a cryogenic temperature regime and are subject to very low electromagnetic and thermal noise. For example, magnetic shielding can be used to shield the system components from stray magnetic fields, optical shielding can be used to shield the system components from optical noise, thermal shielding and cryogenic equipment can be used to maintain the system components at controlled temperature, etc.

In some implementations, the example quantum processing unit 102A can process quantum information by applying control signals to the qubits in the quantum processing unit 102A. The control signals can be configured to encode information in the qubits, to process the information by performing quantum logic gates or other types of operations, or to extract information from the qubits. In some examples, the operations can be expressed as single-qubit quantum logic gates, two-qubit quantum logic gates, or other types of quantum logic gates that operate on one or more qubits. A quantum logic circuit, which includes a sequence of quantum logic operations, can be applied to the qubits to perform a quantum algorithm. The quantum algorithm may correspond to a computational task, a hardware test, a quantum error correction procedure, a quantum state distillation procedure, or a combination of these and other types of operations.

The example control system 105A includes controllers 106A and signal hardware 104A. Similarly, control system 105B includes controllers 106B and signal hardware 104B. All or part of the control systems 105A, 105B can operate in a room-temperature environment or another type of environment, which may be located near the respective quantum processing units 102A, 102B. In some cases, the control systems 105A, 105B include classical computers, signaling equipment (microwave, radio, optical, bias, etc.), electronic systems, vacuum control systems, refrigerant control systems, or other types of control systems that support operation of the quantum processing units 102A, 102B.

The control systems 105A, 105B may be implemented as distinct systems that operate independent of each other. In some cases, the control systems 105A, 105B may include one or more shared elements; for example, the control systems 105A, 105B may operate as a single control system that operates both quantum processing units 102A, 102B. Moreover, a single quantum computing system may include multiple quantum processing units, which may operate in the same controlled (e.g., cryogenic) environment or in separate environments.

The example signal hardware 104A includes components that communicate with the quantum processing unit 102A. The signal hardware 104A may include, for example, waveform generators, amplifiers, digitizers, high-frequency sources, DC sources, AC sources, etc. The signal hardware may include additional or different features and components. In the example shown, components of the signal hardware 104A are adapted to interact with the quantum processing unit 102A. For example, the signal hardware 104A can be configured to operate in a particular frequency range, configured to generate and process signals in a particular format, or the hardware may be adapted in another manner.

In some instances, one or more components of the signal hardware 104A generate control signals, for example, based on control information from the controllers 106A. The control signals can be delivered to the quantum processing unit 102A during operation of the quantum computing system 103A. For instance, the signal hardware 104A may generate signals to implement quantum logic operations, readout operations, or other types of operations. As an example, the signal hardware 104A may include arbitrary waveform generators (AWGs) that generate electromagnetic waveforms (e.g., microwave or radio-frequency) or laser systems that generate optical waveforms. The waveforms or other types of signals generated by the signal hardware 104A can be delivered to devices in the quantum processing unit 102A to operate qubit devices, readout devices, bias devices, coupler devices, or other types of components in the quantum processing unit 102A.

In some instances, the signal hardware 104A receives and processes signals from the quantum processing unit 102A. The received signals can be generated by the execution of a quantum program on the quantum computing system 103A. For instance, the signal hardware 104A may receive signals from the devices in the quantum processing unit 102A in response to readout or other operations performed by the quantum processing unit 102A. Signals received from the quantum processing unit 102A can be mixed, digitized, filtered, or otherwise processed by the signal hardware 104A to extract information, and the information extracted can be provided to the controllers 106A or handled in another manner. In some examples, the signal hardware 104A may include a digitizer that digitizes electromagnetic waveforms (e.g., microwave or radio-frequency) or optical signals, and a digitized waveform can be delivered to the controllers 106A or to other signal hardware components. In some instances, the controllers 106A process the information from the signal hardware 104A and provide feedback to the signal hardware 104A; based on the feedback, the signal hardware 104A can in turn generate new control signals that are delivered to the quantum processing unit 102A.

In some implementations, the signal hardware 104A includes signal delivery hardware that interfaces with the quantum processing unit 102A. For example, the signal hardware 104A may include filters, attenuators, directional couplers, multiplexers, diplexers, bias components, signal channels, isolators, amplifiers, power dividers, and other types of components. In some instances, the signal delivery hardware performs preprocessing, signal conditioning, or other operations to the control signals to be delivered to the quantum processing unit 102A. In some instances, signal delivery hardware performs preprocessing, signal conditioning, or other operations on readout signals received from the quantum processing unit 102A.

The example controllers 106A communicate with the signal hardware 104A to control operation of the quantum computing system 103A. The controllers 106A may include classical computing hardware that directly interface with components of the signal hardware 104A. The example controllers 106A may include classical processors, memory, clocks, digital circuitry, analog circuitry, and other types of systems or subsystems. The classical processors may include one or more single- or multi-core microprocessors, digital electronic controllers, special purpose logic circuitry, e.g., an FPGA (field programmable gate array) or an ASIC (application specific integrated circuit), or other types of data processing apparatus. The memory may include any type of volatile or non-volatile memory or another type of computer storage medium. The controllers 106A may also include one or more communication interfaces that allow the controllers 106A to communicate via the local network 109 and possibly other channels. The controllers 106A may include additional or different features and components.

In some implementations, the controllers 106A include memory or other components that store quantum state information, for example, based on qubit readout operations performed by the quantum computing system 103A. For instance, the states of one or more qubits in the quantum processing unit 102A can be measured by qubit readout operations, and the measured state information can be stored in a cache or other type of memory system in one or more of the controllers 106A. In some cases, the measured state information is subsequently used in the execution of a quantum program, a quantum error correction procedure, a quantum processing unit (QPU) calibration or testing procedure, or another type of quantum process.

In some implementations, the controllers 106A include memory or other components that store a quantum program containing quantum machine instructions for execution by the quantum computing system 103A. In some instances, the controllers 106A can interpret the quantum machine instructions and perform hardware-specific control operations according to the quantum machine instructions. For example, the controllers 106A may cause the signal hardware 104A to generate control signals that are delivered to the quantum processing unit 102A to execute the quantum machine instructions.

In some instances, the controllers 106A extract qubit state information from qubit readout signals, for example, to identify the quantum states of qubits in the quantum processing unit 102A or for other purposes. For example, the controllers may receive the qubit readout signals (e.g., in the form of analog waveforms) from the signal hardware 104A, digitize the qubit readout signals, and extract qubit state information from the digitized signals. In some cases, the controllers 106A compute measurement statistics based on qubit state information from multiple shots of a quantum program. For example, each shot may produce a bitstring representing qubit state measurements for a single execution of the quantum program, and a collection of bitstrings from multiple shots may be analyzed to compute quantum state probabilities.

In some implementations, the controllers 106A include one or more clocks that control the timing of operations. For example, operations performed by the controllers 106A may be scheduled for execution over a series of clock cycles, and clock signals from one or more clocks can be used to control the relative timing of each operation or groups of operations. In some implementations, the controllers 106A may include classical computer resources that perform some or all of the operations of the servers 108 described above. For example, the controllers 106A may operate a compiler to generate binary programs (e.g., full or partial binary programs) from source code; the controllers 106A may include an optimizer that performs classical computational tasks of a hybrid classical/quantum program; the controllers 106A may update binary programs (e.g., at runtime) to include new parameters based on an output of the optimizer, etc.

The other quantum computing system 103B and its components (e.g., the quantum processing unit 102B, the signal hardware 104B, and controllers 106B) can be implemented as described above with respect to the quantum computing system 103A; in some cases, the quantum computing system 103B and its components may be implemented or may operate in another manner.

In some implementations, the quantum computing systems 103A, 103B are disparate systems that provide distinct modalities of quantum computation. For example, the computer system 101 may include both an adiabatic quantum computing system and a gate-based quantum computer system. As another example, the computer system 101 may include a superconducting circuit-based quantum computing system and an ion trap-based quantum computer system. In such cases, the computer system 101 may utilize each quantum computing system according to the type of quantum program that is being executed, according to availability or capacity, or based on other considerations.

Figure 2:
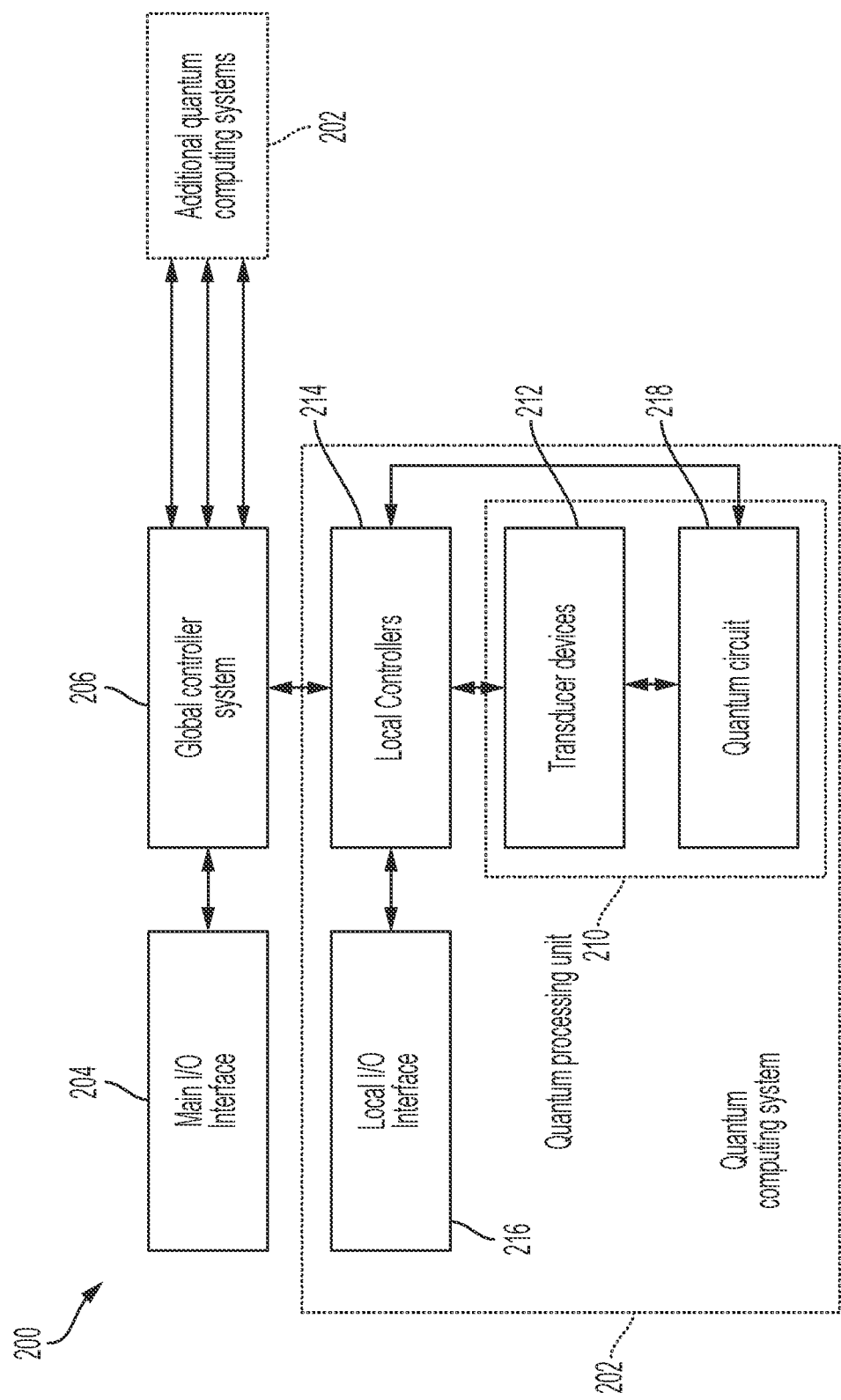
FIG. 2 is a schematic diagram of an example quantum computing network.

FIG. 2 is a block diagram showing aspects of an example quantum computing network 200. The example quantum computing network 200 for distributed quantum computing is a photonic quantum computing network, which uses optical elements for creating quantum entanglement between remote quantum computing systems 202. In some instances, the quantum entanglement created among qubit devices in remote quantum computing systems is heralded by "which-path" entanglement. The quantum computing network 200 based on "which-path" entanglement can be implemented as the example quantum computing network 500 described in FIG. 5. As shown in FIG. 2, the example quantum computing network 200 includes a main input/output (I/O) interface 204, a global controller system 206, and multiple quantum computing systems 202. In some implementations, the example quantum computing network 200 may include additional and different features or components and components of the example quantum computing network 200 may be implemented in another manner.

In some implementations, the main I/O interface 204 is configured to arrange the distributed quantum computing. In some instances, the main I/O interface 204 can be used as a portal for receiving instructions, e.g., from the user device 110, to be computed within the quantum computing network 200 and returning results, e.g., to the user device 110. In some implementations, classical data flows between the main I/O interface 204 and the global controller system 206.

As shown in FIG. 2, the global controller system 206 is communicably coupled with the quantum computing systems 202 forming the quantum computing network 200. In some implementations, the global controller system 206 is configured to perform synchronization and orchestration within the quantum computing network 200. In some implementations, the global controller system 206 includes photonic sources, switches, photodetectors, and other optical elements to generate quantum entanglement between qubit devices in remote quantum computing systems 202. In some instances, the global controller system 206 can link local supporting computations, such as error correction and runtime algorithmic execution, for instance conventional algorithms, quantum algorithms, or hybrid quantum-classical algorithms.

As shown in FIG. 2, each of the quantum computing systems 202 includes a quantum processing unit 210, local controllers 214, and local I/O interface 216. A quantum processing unit 210 is configured to process quantum information requested by the local controllers 214, including executing quantum algorithms, quantum error correction, and performing quantum entanglement distillation, or other types of quantum operations. In some instances, the quantum processing unit 210 in a quantum computing system 202 can be configured to perform hybrid quantum-classical algorithms or other types of quantum algorithms. In some instances, a quantum computing system 202 may include multiple quantum processing units 210.

In some implementations, the quantum processing unit 210 of a quantum computing system 202 includes a quantum circuit 218. In some implementations, the quantum processing unit 210 is a superconducting quantum processing unit and the quantum circuit 218 includes superconducting quantum circuit devices connected by superconducting circuitry. In some instances, the quantum circuit 218 of a quantum processing unit 210 includes qubit devices (e.g., fixed-frequency qubit devices and tunable-frequency qubit devices), or other superconducting quantum circuit devices. In some examples, each of the qubit devices in the quantum circuit 218 of a quantum processing unit 210 can be encoded with a single bit of quantum information.

In some implementations, each of the qubit devices in the quantum circuit 218 of a quantum processing unit 210 has two eigenstates that are used as computational basis states (e.g., $|0\rangle$ and $|1\rangle$), and each qubit device can transition between its computational basis states or exist in an arbitrary superposition of its computational basis states. In some examples, the two lowest energy levels (e.g., the ground state and first excited state) of each qubit device are defined as a qubit and used as computational basis states for quantum computation. In some examples, higher energy levels (e.g., a second excited state or a third excited state) can be used to define a qubit, a qutrit, or a multi-level quantum computational device in some instances. Quantum states (e.g., qubits) defined by respective qubit devices in a single quantum processing unit 210 can be manipulated by control signals, or read by readout signals, generated by the local controllers 214. In some instances, the control signals are transmitted on control signal lines as part of the quantum circuit 218 of the quantum processing unit 210. The qubit devices in a quantum processing unit 210 can be controlled individually, for example, by delivering control signals from the local controllers 214 to the respective qubit devices in the quantum processing unit 210. In some cases, readout devices can detect the states of the qubit devices, for example, by interacting directly with the respective qubit devices.

In some implementations, the quantum processing unit 210 is a modular quantum processing unit which may include multiple quantum processor modules. In certain instances, each of the multiple quantum processor modules includes a subset of the qubit devices in the quantum processing unit 210, connections among the qubit devices, and potentially other hardware features that define an appropriate lattice for one or more quantum error correction codes to be applied.

In some instances, quantum processor modules in a quantum processing unit 210 can be interconnected to each other. Couplings between quantum processor modules can be used to apply multi-qubit quantum logic gates or other types of operations to qubits in distinct quantum processor modules within the same quantum processing unit 210. Quantum logic gates can be used to provide quantum entanglement between qubits in distinct quantum processor modules of the same quantum processing unit 210. The quantum processor modules can be arranged in the quantum processing unit 210 as an array in a two-dimensional or three-dimensional lattice structure. In some implementations, the quantum processing unit 210 may include additional and different features or components, and components of the example quantum processing unit 210 may be implemented in another manner. In certain instances, the connections between quantum processor modules can be configured by the global controller system 206 and may vary during the execution of a quantum algorithm.

Figure 10A:
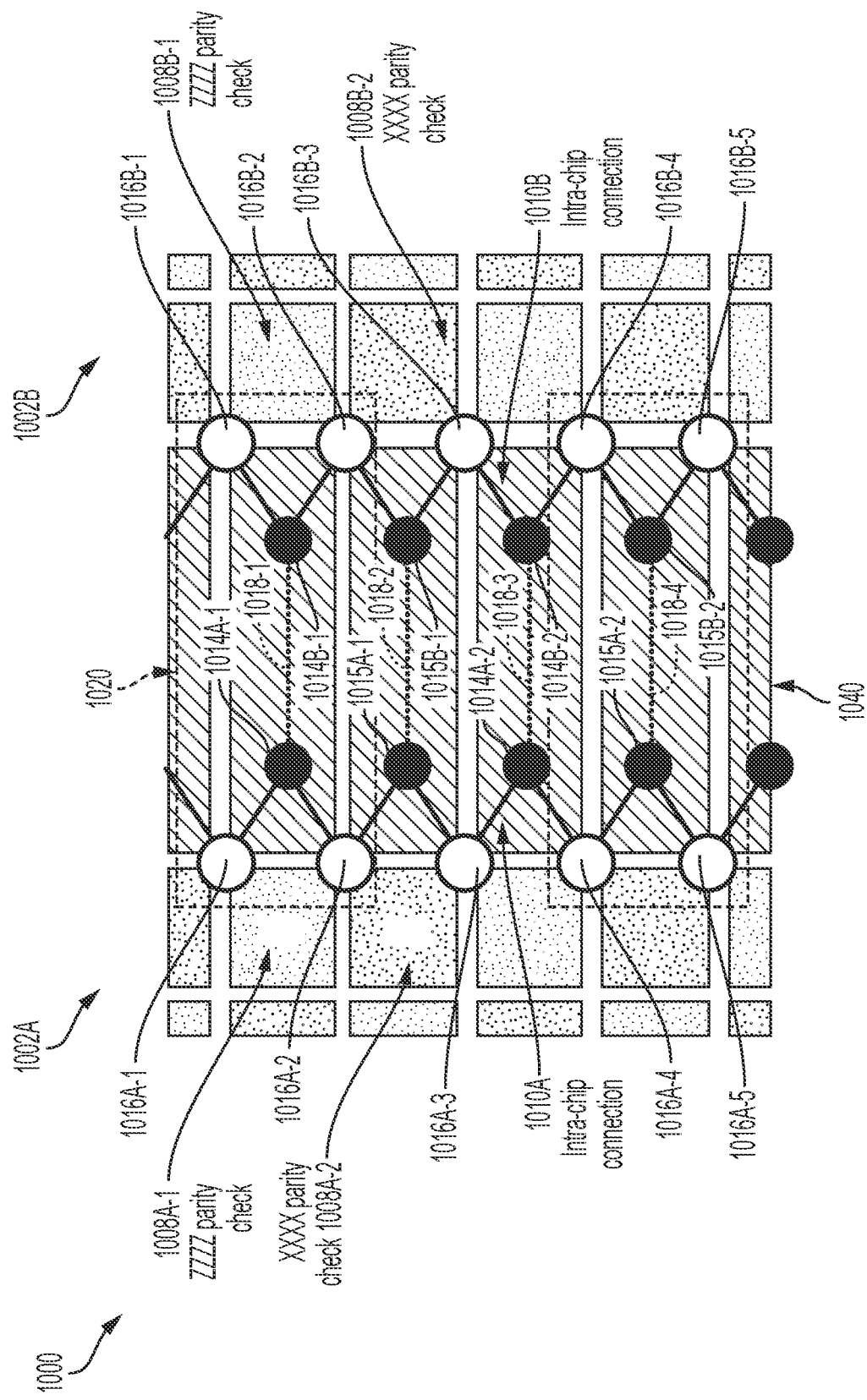
FIG. 10A is a block diagram showing aspects of an example quantum computing network.

In some implementations, to operate planar surface codes across the quantum processing unit 210, only boundary qubit devices on quantum processor modules in the same quantum computing system 202 or remote quantum computing systems 202 need to be communicably coupled to one another (e.g., in the example quantum computing network 1000 shown in FIG. 10A). Higher-dimensional codes may require more connectivity between the quantum processing units 210 in a quantum computing system 202.

Although each individual qubit device defines a single qubit, a lattice of qubit devices in the quantum processing unit 210 or qubit devices in a quantum processor module may operate collectively as a single logical qubit. For example, a stabilizer code or another type of quantum error correction scheme can be applied to the lattice of qubit devices. In some cases, one of the qubit devices operates as a data qubit device, other qubit devices in the lattice operate as ancilla qubit devices, and a quantum error correction scheme is applied to the lattice. The ancilla qubit devices may be used to detect an error syndrome, which can be used to correct errors on the data qubit device. Examples of stabilizer codes include surface codes, color codes, and other types of quantum error correcting codes.

In some instances, the quantum circuit 218 may include flux bias control lines which can provide magnetic flux locally to tunable-frequency qubit devices to tune their frequencies. The quantum circuit 218 may include tunable coupler devices, microwave feedlines, and resonator devices which are capacitively coupled to qubit devices to readout qubits. In some examples, the quantum circuit 218 may include microwave feedlines which are coupled to one or several of the resonator devices to allow microwave excitation of the resonator devices used to readout qubits. In this case, the quantum circuit 218 may include microwave drive lines which are capacitively coupled to qubit devices to drive qubits. The quantum circuit 218 may further include filters, isolators, circulators, amplifiers, or other circuit elements.

As shown in FIG. 2, each of the quantum computing systems 202 includes a local I/O interface 216 which supports interfacing instructions to be computed within the quantum processing unit 210. In some implementations, the local controllers 214 are configured to perform orchestration of the execution of instructions on the associated hardware/software within the quantum computing system 202 in coordination with the global controller system 206, for example, coherent transmission of quantum optical states between qubit devices in remote quantum computing systems 202, e.g., between the local controllers 214 of the remote quantum computing systems 202, through the global controller system 206 of the quantum computing network 200.

As shown in FIG. 2, a quantum processing unit 210 further includes transducer devices 212. In some implementations, each of the transducer devices 212 is configured to receive an optical excitation from the global controller system 206 through the local controllers 214, and to generate optical and microwave modes that contains entangled optical-microwave photon pairs. In some implementations, the microwave mode is transmitted within the respective quantum processing unit 210, e.g., from the transducer devices 212 to a qubit device in the quantum circuit 218; and the optical mode is transmitted out of the quantum processing unit 210, e.g., from the transducer devices 212 to the global controller system 206 via the local controllers 214. In some instances, a photon can be generated by a qubit device in the quantum circuit 218 and transmitted back to the transducer device 212 to generate heralded entanglement. One example process is described in the publication entitled "Optically-Heralded Entanglement of Superconducting Systems in Quantum Networks" by S. Krastanov, et al. (arXiv: 2012.13408v3 [quantu-ph] Dec. 24, 2020).

In some implementations, a transducer device 212 in a quantum processing unit 210 includes an electro-optic transducer device. In some instances, the transducer device 212 may include an electro-optomechanical transducer device, an opto-magnetic transducer device, a transducer device based on trapped atoms, or other types of transducer devices. In some implementations, each of the transducer devices 212 is a direct transducer device which directly converts a signal in one form of energy to a signal in another. In some implementations, a transducer device 212 is configured to convert a pump laser signal, e.g., an optical excitation, generated by a pump laser system of the global controller system 206, to a microwave mode and an optical mode. The microwave mode includes photons in a microwave frequency range, e.g., microwave photons; and the optical mode includes photons in an optical frequency range, e.g., optical photons, which is distinct from the frequency of optical photons in the pump laser signal.

In some implementations, a transducer device 212 in a quantum processing unit 210 includes a photonic circuit with optical circuit elements and a superconducting microwave circuit with microwave circuit elements. For example, a transducer device 212 may include optical waveguides, optical ring resonators, optical couplers, modulators, switches, filters, and other optical circuit elements. A transducer device 212 may include microwave transmission lines, microwave resonators, filters, and other microwave circuit elements. In some implementations, a transducer device 212 is implemented as the transducer devices 304, 522A, 522B in FIGS. 3 and 5, or in another manner. In some implementations, the transducer device 212 includes a lithium niobate thin film material. One example transducer device is described in the publication entitled "Cavity Electro-optics in Thin-film Lithium Niobate for Efficient Microwave-to-optical Transduction" by J. Holzgrafe, et al. (arXiv: 2005.00939V2 [quantu-ph] May 2, 2020).

In some aspects of what is described here, the transducer devices 212 and the quantum circuit 218 of the quantum processing unit 210 are communicably coupled to the local controllers 214. In some instances, the local controllers 214 deliver control signals to the transducer devices 212 and the quantum circuit devices of the quantum circuit 218. In certain instances, the local controllers 214 can also receive readout signals from the qubit devices of the quantum circuit 218. In certain instances, the local controllers 214 include connector hardware elements which include signal lines, signal processing hardware, filters, feedthrough devices (e.g., light-tight feedthroughs, etc.), and other types of components. In some implementations, the connector hardware elements of the local controllers 214 can span multiple different temperature and noise regimes. For example, the connector hardware elements can include a series of thermal stages operating at different temperatures, e.g., 60 Kelvin (K), 3 K, 800 milli Kelvin (mK), 150 mK, that decrease between a higher temperature regime of the global controller system 206 and local controllers 214 and a lower temperature regime of the quantum processing unit 210. In some instances, components of the local controllers 214 can operate in a room temperature regime, an intermediate temperature regime, or both. For example, the local controllers 214 can be configured to operate at much higher temperatures and be subject to much higher levels of noise than are present in the environment of the quantum processing unit 210.

In some implementations, the quantum processing unit 210 including the transducer devices 212 and the quantum circuit 218, and part of the local controllers 214 can be maintained in a controlled cryogenic environment, (e.g., cooled using liquid helium). One or more electrically conductive layers (or at least a portion) in the quantum circuit 218 can operate as a superconducting layer at that temperature. The environment can be provided, for example, by shielding equipment, cryogenic equipment, and other types of environmental control systems. In some examples, the components in the quantum processing unit 210 operate in a cryogenic temperature regime and are subject to very low electromagnetic and thermal noise. For example, magnetic shielding can be used to shield the system components from stray magnetic fields, optical shielding can be used to shield the system components from optical noise, and thermal shielding and cryogenic equipment can be used to maintain the system components at controlled temperatures, etc.

In some instances, information is encoded in the qubit devices of the quantum circuit 218, and the information can be processed by operation of the qubit devices. For instance, input information can be encoded in the computational states or computational subspaces defined by some or all of the qubit devices of the quantum circuit 218. The input information can be processed, for example, by applying a quantum algorithm or other operations.

In some aspects of operation, the local controllers 214 send control signals to the qubit devices of the quantum circuit 218. The control signals can be configured to manipulate the qubits defined by the qubit devices. In some implementations, a control signal can be a direct current (DC) signal communicated from the local controller 214 to the individual qubit device. In some implementations, a control signal can be an alternating current (AC) signal communicated from the local controllers 214 to the individual qubit device. In some cases, the AC signal may be superposed with a direct current (DC) signal. Other types of control signals may be used. In some instances, the local controller 214 identifies a quantum logic gate to be applied to qubit devices and possibly other quantum circuit devices in respective quantum processing unit 210. The local controller 214 can perform the quantum logic gate operations by communicating the control signals to a control line that is coupled to the qubit device in a quantum processing unit 210. In certain instances, the local controllers 214 shown in FIG. 2 may include, for example, a signal generator system, a program interface, a signal processing system, and possibly other system components.

In some aspects of operation, the local controllers 214 can also send control signals to the transducer devices 212, optical circuit elements, microwave circuit elements on the quantum processing unit 210. For example, the local controllers 214 can transmit control signals to the transducer device 212 to tune resonant frequencies of optical ring resonators (e.g., the optical resonators 326A, 326B of the transducer device 304 in FIG. 3). For another example, the local controllers 214 may apply control signals to the pump filters for filtering the pump laser signal, e.g., the pump filter 306 in FIG. 3 and pump filter 712 in FIG. 7B.

Figure 3:
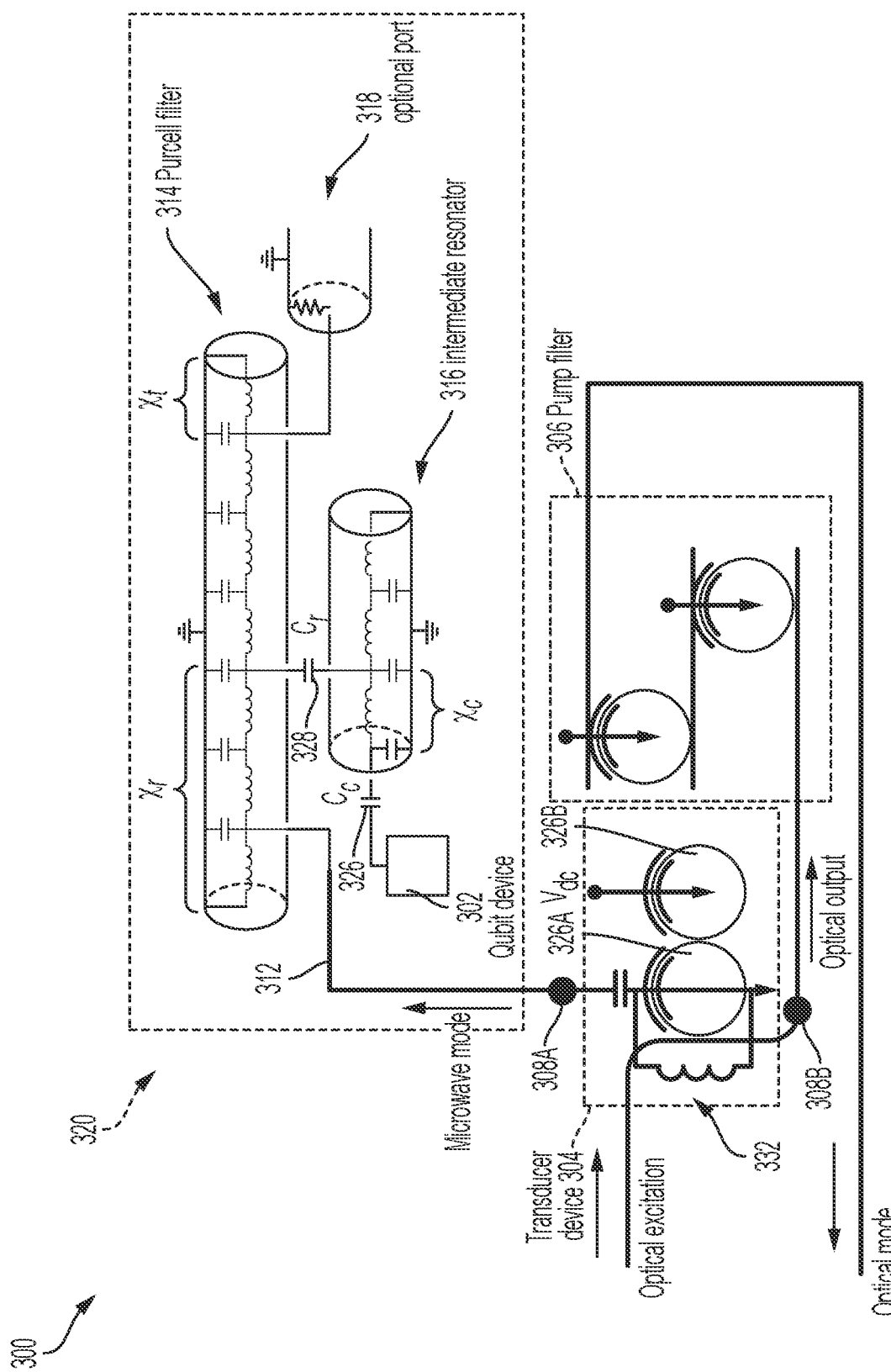
FIG. 3 is a schematic diagram showing aspects of an example quantum processing unit.
Figure 5:
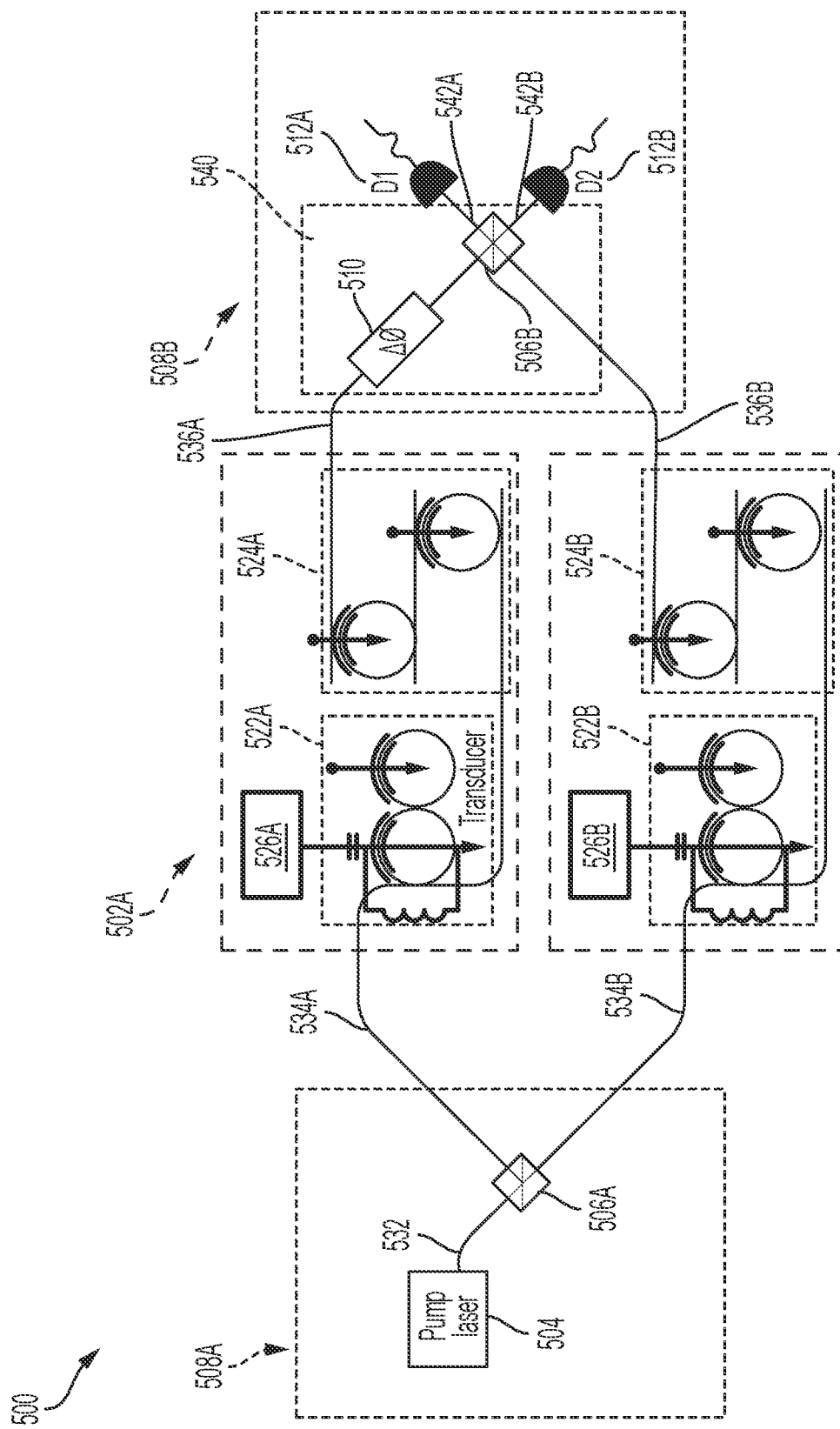
FIG. 5 is a schematic diagram showing aspects of an example quantum computing network.

FIG. 3 is a schematic diagram showing aspects of an example quantum processing unit 300. The example quantum processing unit 300 includes a superconducting quantum circuit 320 and a transducer device 304. The superconducting quantum circuit 320 includes qubit devices 302, and can further include other quantum circuit devices, for example, coupler devices (e.g., capacitive coupler device, tunable coupler device, or others), readout devices, or other types of quantum circuit devices that are used for quantum information processing in the quantum processing unit 300. The superconducting quantum circuit 320 may include one or more Josephson junctions, capacitors, inductors, and other types of circuit elements. As shown in FIG. 3, the superconducting quantum circuit 320 further includes microwave transmission lines 312, a Purcell filter 314, and an intermediate resonator 316. The example quantum processing unit 300 further includes a pump filter 306. The quantum processing unit 300 can be implemented as the quantum computing systems 210, 502A, 502B in the quantum computing networks 200 and 500 as shown in FIGS. 2 and 5, or in another manner. In some implementations, the example quantum processing unit 300 may include additional and different features or components and components of the example quantum processing unit 300 may be implemented in another manner.

As shown in FIG. 3, the transducer device 304 receives an optical excitation. For example, the optical excitation can be an incident pump laser signal from a pump laser source, e.g., in the global controller system 206 in FIG. 2. The optical excitation includes optical photons in a first optical frequency range. In some instances, the optical excitation is transmitted to the transducer device 304 via optical fibers. In some instances, an optical coupler may be used to enable communication between the optical fibers that carry the optical excitation and the transducer device 304. An optical coupler can be further optically coupled to a transducer device 304 through optical waveguides. In certain instances, an optical coupler may include various structures with high coupling efficiency and low reflection losses. For example, an optical coupler may include multiple gratings, and can be fabricated in one or more dielectric layers on the same substrate as the transducer device 304.

In some implementations, the transducer device 304 is a direct electro-optical transducer device, which is configured to receive the optical excitation and convert the received optical excitation to a microwave mode and an optical mode. In other words, an optical photon in the first optical frequency range can be converted, by operation of the transducer device 304, to a pair of correlated and entangled microwave and optical photons. The generated optical photons in the optical mode are in a second optical frequency range that is different from the first optical frequency range of the optical excitation.

As shown in FIG. 3, the transducer device 304 includes first and second optical ring resonators 326A, 326B which are evanescently coupled; and the transducer device 304 further includes a superconducting microwave resonator 332 which includes an inductor element and a capacitor element. Each of the optical ring resonators 326A, 326B includes a lithium niobate triplet resonator device. The superconducting microwave resonator 332 is configured to modulate the received optical excitation. Parametrically coupled optical ring resonators 326A, 326B and microwave resonator 332 are used to generate photon pairs. Examples of photon pair generation in parametrically coupled resonators are described in the publication entitled "Non-classical Correlations between Single Photons and Phonons from a Mechanical Oscillator" by Riedinger, et al. (arXiv: 1512.05360v2 [quant-ph], Dec. 16, 2015), and in the publication entitled "Cryogenic microwave-to-optical conversion using a triply resonant lithium-niobate-on-sapphire transducer" by T. P. McKenna et al. (arXiv:2005.00897v1 [quant-ph] May 2, 2020)

In some implementations, the microwave mode is transmitted within the quantum processing unit 300. Particularly, the microwave mode, generated by operation of the transducer device 304, is transmitted from the superconducting microwave resonator 332 to a qubit device 302 of the superconducting quantum circuit 320 through a first output port 308A. In some implementations, the qubit device 302 may be implemented as a transmon device, a fluxonium device, or another type of superconducting qubit device. In some examples, the qubit frequency of a qubit device 302 is not tunable by application of an offset field and is independent of magnetic flux experienced by the qubit device. For instance, a fixed-frequency qubit device may have a fixed qubit frequency that is defined by an electronic circuit of the qubit device. As an example, a superconducting fixed-frequency qubit device (e.g., a fixed-frequency transmon qubit device) may be implemented without a SQUID (Superconducting Quantum Interface Device) loop.

In some examples, the qubit frequency of a qubit device 302 is tunable, for example, by application of an offset field. For instance, a superconducting tunable-frequency qubit device may include a superconducting loop (e.g., a SQUID loop), which can receive a magnetic flux that tunes the qubit frequency of a tunable-frequency qubit device. The transition frequency is also known as "resonant frequency" or "fundamental frequency", which is defined by the energy difference between the first and second excited states of the qubit divided by Planck's constant (e.g., according to $\omega=E/h$). The transition frequency also defines the operating frequency of the example tunable-frequency qubit device. A tunable-frequency qubit device may be implemented as a tunable-frequency transmon qubit device or another type of tunable-frequency qubit device. For example, a tunable-frequency qubit device may include two Josephson junctions connected in parallel with each other to form a SQUID loop, which resides adjacent to a control signal line (e.g., a flux-bias control line). The tunable-frequency qubit device further includes a shunt capacitor connected with the two Josephson junctions in parallel.

In this case, the superconducting quantum circuit 320 may include flux-bias control lines for tuning the magnetic flux through the SQUID loop of the qubit device 302. Manipulating the magnetic flux through the SQUID loop, can increase or decrease the operating frequency of the example tunable-frequency qubit device. In some instances, the operating frequency may be tuned in another manner, for instance, by another type of control signal. In some implementations, the flux modulation signal can be applied to a flux bias element to obtain a modulated magnetic flux applied to the SQUID loop. The modulated magnetic flux applied to the SQUID loop can cause a modulation to the transition frequency of the tunable-frequency qubit device.

In this case, a tunable-frequency qubit device enables parametric control to coherently absorb microwave radiation from the transmission line plus the resonator circuit with tunable coupling strengths, allowing for pulse shaping the absorption process, for instance with a time-reversed profile relative to the incoming signal from the transducer device 304. In other words, tuning the coupling strength between elements or the frequencies of resonant modes can be used to achieve suitable shaping of the capture process. One example parametric control on a tunable-frequency qubit device is described in the publication entitled "Parametrically Activated Entangling Gates using Transmon Qubits" by S. Caldwell et al., (arXiv:1706.06562v2 [quantu-ph] Dec. 8, 2017). One example process for catching shaped microwave photons is escribed in the publication entitled "Catching Shaped Microwave Photons with 99.4% Absorption Efficiency", by Wenner et al. (arXiv:1311.1180v2 [quant-ph] Nov. 16, 2013).

As shown in FIG. 3, the microwave photons in the microwave mode are transmitted to the qubit devices 302 of the superconducting quantum circuit 320 via a microwave transmission line 312. In some instances, a microwave transmission line 312 may be implemented as, for example coplanar waveguides, substrate integrated waveguides, or another type of planar transmission line. As shown in FIG. 3, the microwave photons are further transmitted through the Purcell filter 314 and the intermediate resonator 316. In some implementations, the Purcell filter 314 includes one or more coupled linear resonators and is configured to filter microwave photons in a microwave mode generated by the transducer device 304. This filter allows for rapid collection of the incoming microwave photons during an active state without damping the capture circuit during a storage state. One example Purcell filter is described in the publication entitled "Computational modeling of decay and hybridization in superconducting circuits" by M. G. Scheer and M. B. Block (arXiv:1810.11510v3 [quantu-ph] Mar. 21, 2019). In some examples, the intermediate resonator 316 can be made to have the same frequency as the operating frequencies of the qubit device 302 and the superconducting microwave resonator 332 of the transducer device 304. In some instances, frequency tuning can be achieved by tuning fabrication parameters during the manufacturing process or by applying control signals on the qubit device (e.g., flux-bias control signals on a tunable-frequency qubit devices). One example intermediate resonator is described in the publication entitled "Microwave Quantum Link between Superconducting Circuits Housed in Spatially Separated Cryogenic Systems" by P. Magnard et al. (arXiv:2008.01642v1 [quantu-ph] Aug. 4, 2020). In some implementations, the intermediate resonator 316 includes one or more Josephson junctions and is configured to maintain coherence of the microwave photons that are transmitted to the qubit device 302. As shown in FIG. 3, the qubit device 302 is capacitively coupled to the intermediate resonator 316 through a first capacitor 326. The intermediate resonator 316 is further capacitively coupled to the Purcell filter 314 through a second capacitor 328. The Purcell filter 314 includes one or more optional ports 318 which are configured to allow for control of the qubit device 302. For example, the optional port 318 can be configured to perform quantum logic gate operations, readout operations, or other types of quantum operations.

In some implementations, an optical output including the optical mode together with unconverted optical excitation is transmitted out of the example quantum processing unit 300 through a second output port 308B. In some instances, to remove the unconverted optical excitation, the optical output can be filtered by the pump filter 306. As a result, the example quantum processing unit 300 outputs the optical mode generated by the transducer device 304. In some instances, the optical mode from the quantum processing unit 300 can be transmitted back to the global controller system 206 as shown in FIG. 2 or other components. In some instances, the pump filter 306 includes a sequence of serial-coupled or parallel-coupled optical ring resonators. As shown in FIG. 3, the pump filter 306 includes a pair of serial-coupled optical ring resonators. In certain instances, the pump filters 306 may include a sequence of optical ring resonators configured in different manner (e.g., the example pump filter 712 shown in FIG. 7B), or other components.

In some instances, the quantum processing unit 300 includes multiple superconducting quantum circuits 320, each of which includes a qubit device 302 and corresponding control circuitry, e.g., a Purcell filter 314, an intermediate resonator 316, and other quantum circuit devices. In this case, each of the qubit devices 302 with the corresponding control circuitry can be, communicably coupled to one or more transducer devices 304 through distinct microwave transmission lines 312 using frequency multiplexing or spatial multiplexing. For example, the quantum processing unit 300 includes a demultiplexer which is configured to select a particular qubit device 302 in a particular superconducting quantum circuit 320 on the quantum processing unit 300 for receiving the microwave mode from a particular transducer device 304.

In this case, multiple qubit devices 302 in the quantum processing unit 300 are arranged in a rectilinear (e.g., rectangular, or square) array that extends in two spatial dimensions (e.g., in the plane of the page), or in another type of ordered array. In some instances, the rectilinear array also extends in a third spatial dimension (e.g., in/out of the page), for example, to form a cubic array or another type of three-dimensional array. In some instances, the example quantum processing unit 300 is a modular quantum processing unit that includes multiple quantum processor modules. Each of the quantum processor modules includes a subset of the qubit devices in the quantum processing unit 300. In certain examples, qubit devices and corresponding control circuitry in a quantum processor module are communicably coupled to a transducer device 304.

In some instances, the superconducting quantum circuit 320 can be supported by a first substrate; and the transducer device 304, the pump filter 306, and other optical circuit elements (e.g., optical coupler, waveguides, etc.) can be supported by a second substrate. In this case, the superconducting quantum circuit 320 on the first substrate and the transducer device 304 on the second substrate are galvanically or capacitively coupled, for example via superconducting bonding bumps or capacitive electrodes. In some instances, the superconducting quantum circuit 320, the transducer device 304, the pump filter 306, and the other circuit elements of the quantum processing unit 300 are supported on a common substrate.

In some implementations, the first and second substrates may include a dielectric substrate (e.g., silicon, sapphire, etc.). In certain examples, the first and second substrates may include an elemental semiconductor material such as, for example, silicon (Si), germanium (Ge), selenium (Se), tellurium (Te), or another elemental semiconductor. In some instances, the first and second substrates may also include a compound semiconductor such as silicon germanium (SiGe), silicon carbide (SiC), silicon germanium carbide (SiGeC), aluminum oxide (sapphire), gallium arsenide (GaAs), indium arsenide (InAs), indium phosphide (InP), gallium arsenic phosphide (GaAsP), or gallium indium phosphide (GaInP). In some instances, the first and second substrates may also include a superlattice with elemental or compound semiconductor layers. In some instances, the first and second substrates include an epitaxial layer. In some examples, the first and second substrates may have an epitaxial layer overlying a bulk semiconductor or may include a semiconductor-on-insulator (SOI) structure.

In some implementations, the quantum processing unit 300, e.g., the superconducting quantum circuit 320 and the superconducting microwave resonator 332 of the transducer device 304, include superconducting materials. In some implementations, the superconducting materials may be superconducting metals, such as aluminum (Al), niobium (Nb), tantalum (Ta), vanadium (V), tungsten (W), indium (In), titanium (Ti), Lanthanum (La), lead (Pb), tin (Sn), and/or zirconium (Zr), that are superconducting at an operating temperature of the example quantum processing unit 300, or another superconducting metal. In some implementations, the superconducting materials may include superconducting metal alloys, such as molybdenum-rhenium (Mo/Re), niobium-tin (Nb/Sn), or another superconducting metal alloy. In some implementations, the superconducting materials may include superconducting compound materials, including superconducting metal nitrides and superconducting metal oxides, such as titanium-nitride (TiN), niobium-nitride (NbN), zirconium-nitride (ZrN), hafnium-nitride (HfN), vanadium-nitride (VN), tantalum-nitride (TaN), molybdenum-nitride (MoN), yttrium barium copper oxide (Y—Ba—Cu—O), or another superconducting compound material. In some instances, the superconducting materials may include multilayer superconductor-insulator heterostructures.

In some implementations, the superconducting circuit elements and the optical circuit elements in the quantum processing unit 300 can be formed on surfaces of the first or the second substrates and patterned using a microfabrication process or in another manner. For example, the superconducting circuit elements and the optical circuit elements in the quantum processing unit 300 may be formed by performing at least some of the following fabrication processes: using chemical vapor deposition (CVD), physical vapor deposition (PVD), atomic layer deposition (ALD), and/or other suitable techniques to deposit respective superconducting layers on the substrates; and performing one or more patterning processes (e.g., a lithography process, a dry/wet etching process, a soft/hard baking process, a cleaning process, etc.) to form openings in the respective superconducting layers.

In some implementations, the example quantum processing unit 300 resides in a cryogenic environment. For example, the qubit device 302 and the other superconducting circuit elements in the superconducting quantum circuit 320 can be supported on a thermal stage with a low temperature (e.g., 10 milli Kelvin (mK)) and the transducer device 304 and the other optical circuit elements can be supported on the same thermal stage at the same temperature. In this case, the microwave modes generated by the transducer devices 304 can be thermalized to similar temperature limits. In some examples, the transducer device 304 and the other optical circuit elements can be supported on a different thermal stage with a slightly higher temperature in the cryogenic environment (e.g., 100 mK or another temperature).

FIG. 4 is a table 400 showing parameters of an example transducer device. The example transducer device may be implemented as the transducer device 212, 304 in FIGS. 2 and 3 for creating pairs of entangled microwave-optical photons under an external optical excitation. For example, the example transducer device can be used to create quantum entanglement between remote quantum computing systems. In some implementations, the transducer device is a triply resonant, direct electro-optic transducer device operated based on a pulse spontaneous parametric down-conversion scheme. In some implementations, the electro-optic transducer device includes a lithium niobate thin film resonator device.

In some implementations, such example transducer device can provide technical advantages. For example, the electro-optic transducer device does not require narrow-bandwidth intermediate states; can provide a fast decay time of the microwave resonator and, thus a high maximum repetition rate. For another example, a lithium niobate resonator device can provide high nonlinearity and low loss, which enables the transducer device to operate on low pump power at low temperature. In some implementations, a direct electro-optic transducer device based on a lithium niobate thin film resonator device can also support tunable optical modes and can be integrated with high efficiency pump filters. In some cases, a combination of these and potentially other advantages and improvements may be obtained.

A generation rate of entangled microwave-optical photon pairs by the example transducer device can be determined according to the parameters of the example transducer device shown in FIG. 4. For example, based on demonstrated optical quality factors of ≥$10^7$ in a lithium niobate thin film, an optical linewidth of 100 MHz with a coupling ratio of 3 can be estimated. Assuming a strongly overcoupled microwave resonator with a coupling ratio of 10, a microwave linewidth of 10 MHz can be estimated. A repetition rate for a quantum entanglement generation protocol can be limited by the rate at which a superconducting microwave resonator in a transducer device (e.g., the superconducting microwave resonator 332 of the transducer device 304 in FIG. 3) returns to the ground state, which is approximately one tenth of a decay rate of the superconducting microwave resonator. A total optical loss between a transducer device and the photodetector devices is approximately 6 dB, including 2 dB of fiber-to-chip coupling loss and 4 dB of loss due to other sources including filtering and detector efficiency. The probability ($p_s$) to successfully generate entangled microwave-optical photon pairs is given by $$p_s = 4g_0^2 N/\kappa_0^2 \quad (1)$$

where $g_0$ is the single photon coupling rate, e.g., $g_0/2\pi=2$ kHz, N is the number of pump photons in a pulse of the incident pump laser signal, and $\kappa_0/2\pi$ is the optical linewidth. For 2 µW of average input power of the incident pump laser signal, the probability for successfully generating a pair of entangled microwave-optical photons in a single attempt at remote entanglement generation on a single link is 2%. Consider the total optical loss of 6 dB, the probability to herald remote quantum entanglement is 0.5%, corresponding to a quantum entanglement generation rate of $p_s$=4 kHz.

FIG. 5 is a schematic diagram showing aspects of an example quantum computing network 500. As shown in FIG. 5, the quantum computing network 500 includes a global controller system which includes a first portion 508A and a second portion 508B, and two quantum processing units 502A, 502B. The two quantum processing units 502A, 502B reside in remote quantum computing systems on distant sites, which are communicably coupled to the global controller system 508, for example through optical fibers in an optical intranet. In some implementations, the example quantum computing network 500 may include additional and different features or components and components of the example quantum computing network 500 may be implemented in another manner.

As shown in FIG. 5, the first portion 508A of the global controller system includes a pump laser system 504 and a first beam splitter device 506A; and the second portion 508B of the global controller system includes an interferometer device 540 which includes a phase shifter 510 and a second beam splitter device 506B. The second beam splitter device 506B includes two output channels 542A, 542B, which are equipped with respective photodetector devices 512A, 512B. The first portion 508A of the global controller system provides optical input signals to the quantum processing units 502A, 502B; and the second portion 508B of the global controller system receives optical output signals from the quantum processing units 502A, 502B. In some implementations, when optical output signals are detected on the output channels 542A/542B of the interferometer device 540 by the photodetector devices 512A/512B (e.g., a "click" on a photodetector device), quantum entanglement transferred to qubit devices on the two quantum processing units 502A, 502B can be identified.

In some implementations, the pump laser system 504 is configured to generate an incident pump laser signal 532. In some instances, the incident pump laser signal 532 includes classical laser pulses. In some instances, the wavelength of the incident pump laser signal 532 from the pump laser system 504 can be tunable. In some instances, the pump laser system 504 can generate an incident pump laser signal in a mm-wave, terahertz, or optical regime, e.g., about $10^{11}$-$10^{16}$ Hz. In some examples, the pump laser system 504 may include other optical components, for example, lenses, mirrors, diffusers, filters, polarization modifier, amplifier, phase modulator, Bragg gratings, attenuators, photonic crystals, and multiplexer. In certain instances, the pump laser system 504 may provide phase modulation, frequency modulation, and amplitude modulation to the incident pump laser signal 532.

In some instances, the first beam splitter 506A, which is partially reflective and partially transmissive, is used to split the incident pump laser signal 532 into a first optical excitation 534A and a second optical excitation 534B, each along a separate path (e.g., a transmitted path and a reflected path). As shown in FIG. 5, the first quantum processing unit 502A is placed in a path (e.g., the reflected path) of the first beam splitter device 506A to receive a first optical excitation 534A and the second quantum processing unit 502B is placed in the other path (e.g., the transmitted path) of the first beam splitter device 506A to receive a second optical excitation 534B.

In some implementations, optical fibers are used to guide the incident pump laser signal 532 from the pump laser system 504 to the first beam splitter device 506A. Similarly, optical fibers can be also used to guide the first and second optical excitation 534A, 534B to the respective first and second quantum processing units 502A, 502B. In some implementations, the optical fibers may include single-mode optical fibers to improve the quality of the laser beam or multi-mode optical fibers to maintain the intensity of the laser beam. In certain instances, the optical fibers may be implemented as polarization-maintaining optical fibers, photonic-crystal fibers, or another type of optical fiber.

As shown in FIG. 5, each of the quantum processing units 502A, 502B includes a transducer device 522, a pump filter 524, and a superconducting quantum circuit 526. Particularly, the first quantum processing unit 502A includes a first transducer device 522A, a first pump filter 524A, and a first superconducting quantum circuit 526A; and the second quantum processing unit 502B includes a second transducer device 522B, a second pump filter 524B, and a second superconducting quantum circuit 526B. The first and second transducer devices 522A, 522B are illuminated by the respective first and second optical excitations 534A, 534B from the first beam splitter device 506A. Each of the first and second optical excitations 534A, 534B includes part of the incident pump laser signal 532.

In some implementations, each of the transducer devices 522A, 522B is implemented as the transducer device 212, 304 in the quantum processing unit 210, 300 in FIGS. 2-3. The transducer devices 522A, 522B of the respective first and second quantum processing units 502A, 502B receive the respective first and second optical excitations 534A, 534B and generate microwave modes and optical modes at a certain quantum entanglement generation rate. In some implementations, the superconducting quantum circuits 526A, 526B including qubit devices and other quantum circuit elements can be implemented as the superconducting quantum circuit 320 shown in FIG. 3 or in another manner. In some implementations, the superconducting quantum circuits 526A, 526B define respective first paths for the microwave photons in the microwave modes within the first and second quantum processing unit 502A, 502B. In some implementations, the microwave photons may be directly used to perform quantum processing tasks by operating qubit devices, readout devices, tunable coupler devices, or other types of quantum circuit elements in the superconducting quantum circuit 526.

As shown in FIG. 5, each of the first and second quantum processing units 502A, 502B includes a series of optical circuit elements that define respective second paths for the optical photons in the optical modes 536A, 536B generated by the respective transducer devices 522A, 522B. The pump filters 524A, 524B, which are configured to remove unconverted first and second optical excitations 534A, 534B, may be implemented as the pump filters 306, 712 in FIGS. 3 and 7B, or in another manner. In some implementations, the optical modes from the first and second quantum processing unit 502A, 502B are output to the interferometer device 540, for example on optical fibers. The interferometer device 540 includes a phase shifter 510 and a second beam splitter 506B. In some implementations, the phase shifter 510 is configured to introduce a constant phase difference between the two optical modes 536A, 536B from the first and second quantum processing unit 502A, 502B. In some instances, the second beam splitter 506B, which is partially reflective and partially transmissive, is used to split each of the optical modes 536A, 536B received from the first and second quantum processing units 502A, 502B along two separate output channels 542A, 542B.

As shown in FIG. 5, a first photodetector device 512A is placed in a first output channel 542A of the second beam splitter device 506B and a second photodetector device 512B is placed in a second output channel 542B of the second beam splitter device 506B. In some implementations, the photodetector devices 512A, 512B are used to convert the optical output signals on the output channels 542A, 542B to electrical signals. In some implementations, the photodetector devices 512A, 512B include photodiodes, which may be used to detect the optical output signals on the output channels of the interferometer device 540. The output signals on the output channels 542A, 542B may be caused by one of the following: the first optical mode 536A generated by the first quantum processing unit 502A, the second optical mode 536B generated by the second quantum processing unit 502B, or a combination of both. In some implementations, each of the first and second photodetector devices 512A, 512B is a single-photon detector device. In some instances, the photodetector device 512A, 512B may operate in the few-photon limit. When the optical output signals on the output channels 542A, 542B are detected by the photodetector devices 512A, 512B, a successful transmission of quantum entanglements between the qubit devices of the first and second quantum processing units 502A, 502B can be identified.

In some instances, in one round, a repumping laser pulse signal with a frequency different from the incident pump laser signal can be applied to the transducer devices 522A, 522B to set the state back to the ground state. After the transducer devices are set back to the ground state, the same incident pump laser signal is applied to the transducer devices 522A, 522B again. Forward scattered Stokes light from the first and second quantum processing units 502A, 502B is combined at the second beam splitter device 506B of the interferometer device 540. This process can be repeated until the optical output signals on the output channels 542A, 542B are detected by the photodetector devices 512A, 512B. The probability for the photodetector devices 512A, 512B to detect the output optical signals is given by the probability ($p_s$) of successfully generating entangled microwave-optical photon pairs defined in Equation (1) for each round, and thus, the process has to be repeated about $1/p_s$ times for a successful quantum entanglement preparation.

During operation, the pump laser system 504 generates an incident pump laser signal which is split. A portion of the incident pump laser signal (e.g., the first optical excitation 534A) enters the first quantum processing unit 502A; and the other portion of the incident pump laser signal (e.g., the second optical excitation 534B) enters the second quantum processing unit 502B. Nonlinear interactions in the transducer devices 522A, 522B allow for spontaneous parametric down-conversion of the first and second optical excitations, which generates microwave modes and optical modes containing correlated and entangled microwave-optical photon pairs. The optical photons in the respective optical modes are coupled out of the respective quantum processing units 502A, 502B after filtering the unconverted first and second optical excitations. The first output optical signal 536A from the first quantum processing unit 502A is modulated by the phase shifter 510 in the interferometer device 540 to control the optical phase. The optical output signals 536A, 536B produced by the first and second quantum processing units 502A, 502B are interfered and combined on the second beam splitter device 506B to erase "which-path" information. Detection of the optical photons by the photodetector devices 512A, 512B heralds the creation of an entangled microwave-optical photon pair and a successful transmission of the quantum entanglement to the qubit devices in the first and second quantum processing units 502A, 502B by the microwave modes. The entangled Bell state $|\Psi^{\pm}\rangle$ is defined by:

$$|\Psi^{\pm}\rangle = \frac{1}{\sqrt{2}}(|0_{MW}\rangle_A |1_{MW}\rangle_B \pm e^{i\Delta\phi}|1_{MW}\rangle_A |0_{MW}\rangle_B), \quad (2)$$

where $\Delta\varphi$ is the constant phase shift introduced to the first output optical signal 536A, $|0_{MW}\rangle_A$ and $|1_{MW}\rangle_A$ are microwave states corresponding to $|0\rangle$ and $|1\rangle$ photons in a microwave resonator of a first transducer device (e.g., the transducer device 522A in the first quantum computing system 502A in FIG. 5), and $|0_{MW}\rangle_B$ and $|1_{MW}\rangle_B$ are microwave states corresponding to $|0\rangle$ and $|1\rangle$ photons in a microwave resonator of a second transducer device (e.g., the transducer device 522B in the second quantum computing system 502B in FIG. 5).

In some implementations, the quantum entanglement in a form of a Bell pair of entangled microwave states can be applied to qubits defined by the respective qubit devices in the first and second quantum processing units 502A, 502B for further processing. Collecting the entangled microwave state in the qubit devices of the superconducting quantum circuit 526A, 526B in the first and second quantum processing units 502A, 502B by stimulated two-photon Raman absorption, parametrically activated resonant exchange interactions generated by flux modulation, or other techniques, allows the quantum entanglement to be used by the first and second quantum processing units 502A, 502B. Examples of two-photon Raman absorption are described in the publication entitled "Deterministic remote entanglement of superconducting circuits through microwave two-photon transitions" by P. Campagne-Ibarcq et al. (arXiv: 1712.05854v1 [quant-ph], Dec. 15, 2017). Examples of flux modulation are described in the publication entitled "Parametrically activated quantum logic gates" by E. Sete et al. (U.S. Pat. No. 10,483,980).

In some implementations, the scheme for generating quantum entanglement relies on the indistinguishability of optical photons in the output channels 542A, 542B arriving from the two transducer devices 522A, 522B of the two quantum processing units 502A, 502B and the complete extinction of pump photons in the first and second optical excitations 534A, 534B by the pump filters 524A, 524B. One example remote quantum entanglement heralded by "which-path" entanglement is described in the publication entitled "Long-distance Quantum Communication with Atomic Ensembles and Linear Optics" by L. Duan et al. (arXiv:quant-ph/0105105v1 May 22, 2001).

Figure 6:
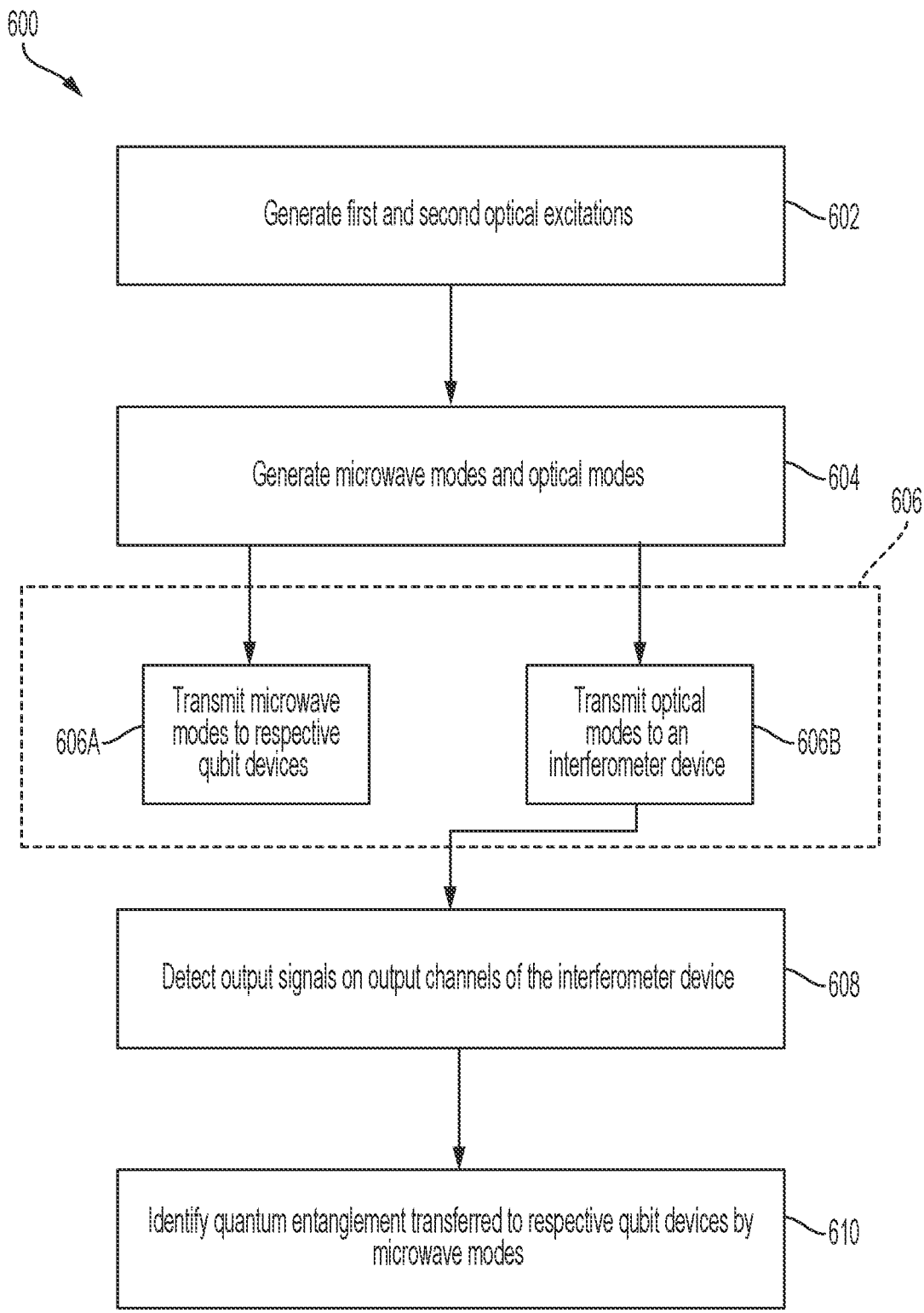
FIG. 6 is a flow chart showing aspects of an example process.

FIG. 6 is a flow chart showing aspects of an example process 600. The example process 600 can be performed, for example, by a quantum computing network. For example, the example process 600 can be performed by operation of the quantum computing network 500 as shown in FIG. 5, or another type of quantum computing network. In some implementations, the example process 600 can be performed to create quantum entanglement between two qubit devices from two remote quantum computing systems. The example process 600 may include additional or different operations, including operations performed by additional or different components, and the operations may be performed in the order shown or in another order.

At 602, first and second optical excitations are generated. In some implementations, the first and second optical excitations are generated for the two qubit devices as part of two superconducting quantum circuits of two quantum processing units. In some instances, the first and second optical excitations can be generated by a pump laser system and a beam splitter device (e.g., the pump laser system 504 and the first beam splitter device 506A in FIG. 5). For example, an incident pump laser signal can be generated by the pump laser system, guided by optical fibers from the pump laser system to the beam splitter device, and split by the beam splitter device into the first and second optical excitation along separate paths. Each of the first and second optical excitations contains a portion of the incident pump laser signal. In some implementations, the first and second optical excitations are guided by optical fibers to the respective remote quantum computing systems.

At 604, microwave modes and optical modes are generated. In some implementations, the first and second optical excitations are received by respective transducer devices of respective quantum processing units in the remote quantum computing systems (e.g., the first transducer device 522A of the first quantum processing unit 502A and the second transducer device 522B of the second quantum processing unit 502B in FIG. 5). In some implementations, nonlinear interactions in the transducer devices allow for spontaneous parametric down-conversion of the first and second optical excitations, which generates respective microwave modes and optical modes containing correlated and entangled microwave-optical photon pairs. The microwave modes and optical modes are generated at a certain quantum entanglement generation rate. In some instances, the transducer devices can be implemented as the transducer devices 522A, 522B in FIG. 5 or in another manner.

At 606, the generated optical modes and microwave modes are transmitted. In some implementations, the generated microwave modes are transmitted within the respective quantum processing units for performing quantum operation or other types of quantum information processing; and the optical modes are transmitted out of the respective quantum processing units for identifying the successful transmission of quantum entanglement between the two qubit devices. Operation 606 includes two sub-operations 606A, 606B.

At 606A, the microwave modes are transmitted to the respective qubit devices in the two quantum processing units. In some implementations, the microwave modes containing microwave photons are transmitted in respective superconducting quantum circuits of the respective quantum processing units. Each of the respective superconducting quantum circuits includes microwave transmission lines, filters, resonators, qubit devices, coupler devices, readout resonator devise, control signal lines (e.g., qubit drive control lines and flux-bias control lines), and other types of quantum circuit elements. In some instances, the superconducting quantum circuits for transmitting the microwave modes can be implemented as the superconducting quantum circuits 320, 526 in FIGS. 3 and 5, or in another manner. In some implementations, the quantum entanglement in a form of an entangled microwave state can be transmitted to qubits defined by the respective qubit devices in the respective quantum processing units for further processing (e.g., quantum entanglement distillation).

At 606B, the optical modes are transmitted out of the quantum processing units. In some implementations, optical output signals from the respective transducer devices include unconverted first and second optical excitations and the generated optical modes. In some implementations, prior to transmitting the optical modes out of the quantum processing units, the optical output signals are filtered by operation of filter pumps to remove the unconverted first and second optical excitations from the generated optical modes. In some instances, the optical filters may be implemented as the optical filters 524A/524B, 712 in FIGS. 5 and 7B, or in another manner. In some instances, the optical modes can be transmitted on optical fibers back to the global controller system, where the optical modes may be processed and detected.

At 608, output signals on output channels of an interferometer device are detected. In some implementations, the optical modes are transmitted from the respective quantum processing units to the interferometer device. One of the optical modes in the output signal from one of the quantum processing units (e.g., the first output optical signal 536A from the first quantum processing unit 502A) can be modulated by a phase shifter (e.g., the phase shifter 510 in FIG. 5). The two optical modes are interfered and combined by operation of another beam splitter device of the interferometer device to erase "which-path" information. In some instances, the interferometer device can be implemented as the interferometer device 540 of the global controller system 508 in FIG. 5, or in another manner. In some implementations, the beam splitter device of the interferometer device includes two output channels (e.g., the output channels 542A, 542B of the second beam splitter device 506B in FIG. 5). The output signals on the two output channels of the interferometer device can be received and detected by two photodetector devices (e.g., the photodetector devices 512A, 512B in FIG. 5, or in another manner).

At 610, based on the output signals, the quantum entanglement transferred to the two qubit devices in the two quantum processing units is identified. In some instances, optical photons in at least one of the optical modes generated by the transducer devices of the respective quantum processing units can be detected by the two photodetector devices. In response to a successful detection of the optical photons in the optical modes by the photodetector devices, a creation of the entangled microwave-optical photon pairs and a successful transmission of the quantum entanglement to the respective qubit devices in the respective quantum processing units by the microwave photons in the microwave modes is identified. In some implementations, transmission of the quantum entanglement to the respective qubit devices includes an application of entangled microwave states to qubits defined by the respective qubit devices.

FIG. 7A is a table 700 showing quantum entanglement generation rates obtained by operation of two example types of transducer devices. Each type of the electro-optic transducer devices is used in a quantum computing network to create a single link of remote entanglement, between two qubit devices and two transducer devices. For example, each type of the electro-optic transducer devices can be implemented in the example quantum computing network 500 in FIG. 5 or in another manner. The quantum entanglement generation rates are estimated according to properties and geometrical designs of lithium niobate-based electro-optic transducer devices reported in literatures. Examples of transducer devices of Generations I and II are described in the publication entitled "Cavity Electro-optics in Thin-film Lithium Niobate for Efficient Microwave-to-optical Transduction" by J. Holzgrafe, et al. (arXiv: 2005.00939V2 [quantu-ph] May 2, 2020).

In Generation I (Gen I), an optical quality factor ($Q_i$) of the transducer devices is $10^6$. An electro-optic interaction rate (the single photon coupling rate) ($g_0$) of the transducer devices is 0.5 kHz. An attempt rate (R) of the transducer devices is 1 MHz. A total estimated detection efficiency ($\eta_{opt}$) of the transducer devices is $-28$ dB, which includes a fiber-chip coupling loss of $-10$ dB, an insertion loss of $-15$ dB, which is from commercial fabry-perot filters, and an additional loss of $-3$ dB, including detector efficiency, fiber loss, and another loss mechanism. An average power of the incident pump laser beam is 2.5 µW. Based on these parameters, the quantum entanglement generation rate ($R_{ent}$) based on transducer devices of Gen I is $10^{-5}$ kHz.

In Generation II (Gen II), an optical quality factor ($Q_i$) of the transducer devices is $10^7$. An electro-optic interaction rate ($g_0$) of the transducer devices is 1.5 kHz. In some instances, the optical quality factor ($Q_i$) can be improved by using wider waveguides in the transducer devices with weaker sidewall scattering. In certain instances, the electro-optic interaction rate ($g_0$) can be improved by optimizing electrode geometries of the transducer devices. An attempt rate (R) of the transducer devices is 1 MHz. A total estimated detection efficiency ($\eta_{opt}$) of the transducer devices is $-6$ dB, which includes a reduced fiber-chip coupling loss of $-3$ dB, a negligible insertion loss, and an additional loss of $-3$ dB. An average power of the incident pump laser beam is 2.5 µW. Based on these parameters, the quantum entanglement rate ($R_{ent}$) based on the transducer devices of Generation II can be improved to 7.5 kHz.

Figure 7B:
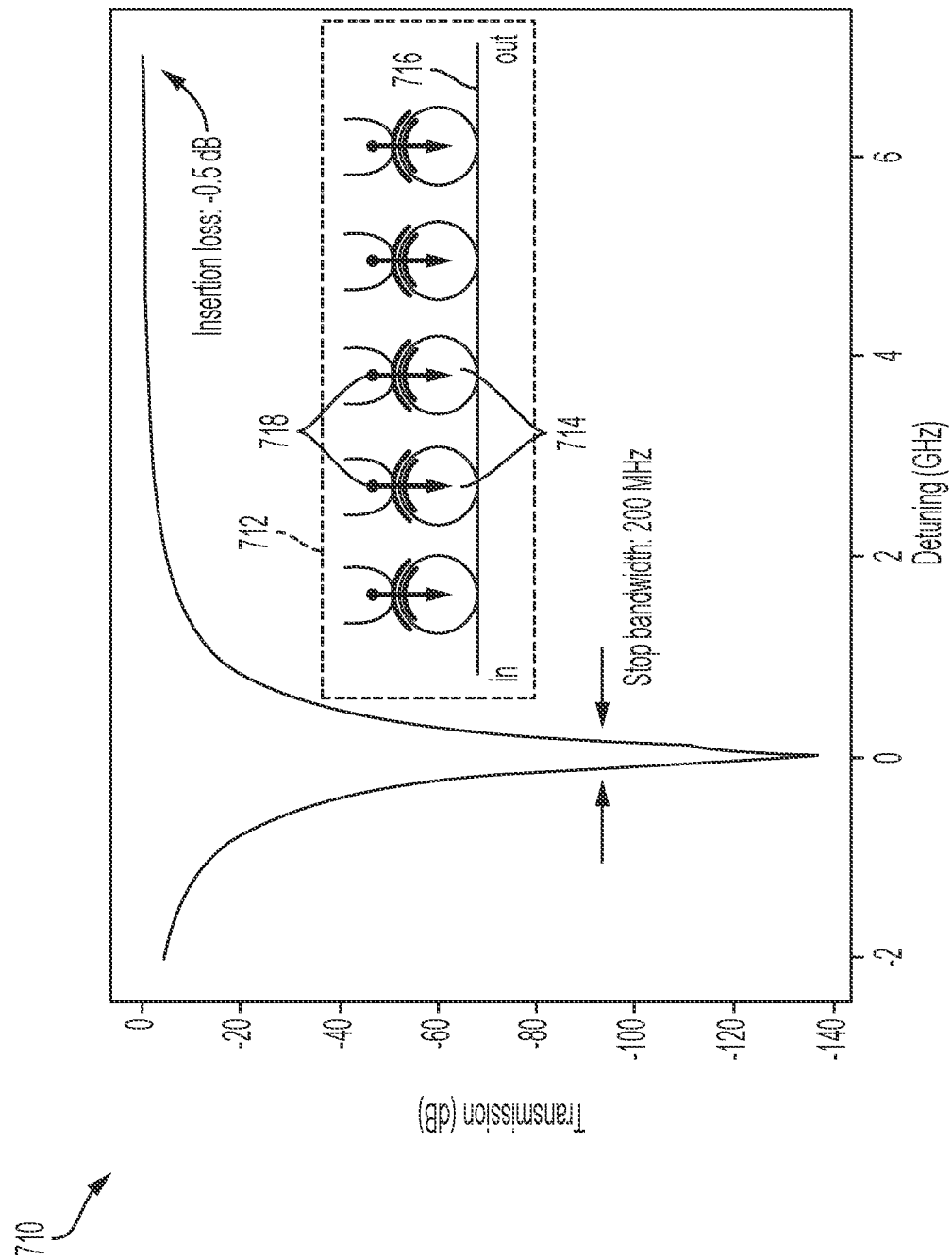
FIG. 7B is a plot of simulated transmission in decibels (dB) as a function of detuning in Giga Hertz (GHz) of an example pump filter.

FIG. 7B is a plot 710 of simulated transmission in decibels (dB) as a function of detuning in Giga Hertz (GHz) of an example pump filter 712. A schematic diagram of the example pump filter 712 is shown as an inset in FIG. 7B. In some implementations, the example pump filter 712 is an on-chip pump filter which can be fabricated on the same substrate as a transducer device in a quantum processing unit, e.g., the transducer devices 304, 522A, 522B of the example quantum processing units 300, 502A, 502B in FIGS. 3 and 5. In some implementations, the pump filter 712 can be operated at a cryogenic temperature with qubit devices and other quantum circuit elements in a quantum processing unit, for example on the lowest-temperature thermal stage in a fridge.

In some implementations, the pump filter 712 includes a sequence of optical ring resonators coupled to a common optical waveguide 716. As shown in FIG. 7B, the example pump filter 712 includes five parallel-coupled optical ring resonators 714 (e.g., $N_{filter}$=5) In certain instances, the pump filter 712 may include a different number of optical ring resonators and the optical ring resonators 714 can be configured relative to the common optical waveguide 716 in a different manner. As further shown in FIG. 7B, each of the five optical ring resonators 714 are associated with a tuning capacitor 718. In some instances, a tuning capacitor 718 includes superconducting materials and is configured to tune the resonant frequency of the associated optical ring resonator 714. The independent electro-optic tunability of the individual optical ring resonators 714 enables that small fabrication-induced variations in the resonant frequencies of the optical ring resonators 714 can be reduced without significant additional heat load to the cryostat.

As shown in FIG. 7B, each of the five optical ring resonators 714 is tunable (e.g., has a tunable resonant frequency) and has a low loss rate. In some instances, the five optical ring resonators 714 in the pump filter 712 have the same geometrical design. In some instances, the low loss rates of optical ring resonators in the lithium niobate platform allow high-extinction low-loss filtering using the pump filter 712. For example, the optical ring resonators 714 in the pump filters 712 may also include lithium niobate material. For example, the pump filter 712 may be off-chip filters or another type of optical filter.

In order to obtain the simulated transmission of the pump filter 712, parameters of each of the five optical ring resonators 714 are assigned. For example, an intrinsic loss rate is 70 Hz, e.g., $\kappa_i/2\pi$=70 Hz; an extrinsic coupling rate between waveguides in a single optical resonator 714 is 1 GHz, e.g., $\kappa_e/2\pi$=1 GHz with a standard deviation of $\Delta\kappa_e/2\pi$=0.1 GHz, caused by typical variations during fabrication; a standard deviation in a resonance frequency is 50 MHz, e.g., $\Delta f_0$=50 MHz, caused by variations in tuning voltages applied on the tuning capacitors 718. The estimated $-95$ dB extinction can be achieved over a stop bandwidth of SBW=200 MHz, with an insertion loss of $-0.5$ dB at a signal frequency of 7 GHz, e.g., the frequency of the incident pump laser signal.

Figure 8:
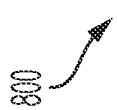
FIG. 8 is a table showing a raw link fidelity of a generated quantum entanglement using the example quantum computing network 500 shown in FIG. 5.

FIG. 8 is a table 800 showing a raw link fidelity of a generated quantum entanglement using the example quantum computing network 500 shown in FIG. 5. In some implementations, a raw link fidelity can be determined by several mechanisms of independent errors or losses across the quantum computing network. For example, the raw link fidelity can be expressed as:

$$F=1-p-2P_m-1.5P_{loss}-P_{false}-P_{phase}, \quad (3)$$

where F represents the raw link fidelity of a generated quantum entanglement; p represents a probability of multi-pair generation; $P_m$ represents the average thermal microwave occupancy; $P_{loss}$ represents the microwave loss between a transducer device and a qubit device (e.g., between the transducer device 522A/522B and the qubit device in the superconducting quantum circuit 526A/526B in FIG. 5); $P_{false}$ represents a probability of false heralding due to dark counts in the photodetector devices (e.g., the photodetector devices 512A/512B in FIG. 5); and $P_{phase}$ is a probability of phase errors due to drift in the interferometer device (e.g., the interferometer device 540 in FIG. 5). In some implementations, the microwave loss $P_{loss}$ represents the total loss in the superconducting quantum circuit 526A/526B in FIG. 5 between the transducer device and the qubit device of the quantum processing unit 502A/502B, including microwave transmission lines, filters, resonator devices, and other superconducting circuit devices.

In some instances, the independent errors described in Equation (3) may be reduced and the raw link fidelity (F) can be improved. A higher raw link fidelity of generated entanglement reduces overhead in quantum computing resources (e.g., number of qubit devices in quantum processing units) required for distillation. In some instances, multi-photon detection schemes can further reduce the sensitivity to some types of noise, at the cost of reduced quantum entanglement generation rate ($R_{ent}$) that scale as $R_{ent} \propto (\eta_{opt} \cdot p)^2$, where $\eta_{opt}$ represents the total estimated detection efficiency, and p represents the probability of multi-pair generation.

In some instances, the average power of the incident pump laser signal can be reduced so as to reduce the probability of multi-pair generation (p) to a negligible level (e.g., p<<1). In certain instances, techniques can be used to reduce the thermal microwave occupancy $P_m$ at a given average power of the incident pump laser signal. For example, the transducer devices can be shielded from stray pump light; and alternative superconducting materials with weak optical absorption and short quasiparticle lifetime can be used. For another example, the transducer devices can be immersed in liquid helium or cooled by another cryogenic cooling technique (e.g., radiative cooling).

In some implementations, separately packaged transducer devices and superconducting quantum processor modules are connected by low-loss superconducting transmission lines which enable communication of quantum information. In some instances, techniques for light-tight shielding of superconducting qubit devices can be applied enabling operation of the superconducting quantum processor modules without added noise from the transducer devices (e.g., from stray optical light). In some instances, the techniques for light-tight shielding bring the transducer devices and other optical circuit elements closer to the superconducting quantum processor modules to reduce the microwave loss ($P_{loss}$). Examples of light-tight shielding are described in the publication entitled "Optimization of Infrared and Magnetic Shielding of Superconducting TiN and Al Coplanar Microwave Resonators" by J. M. Kreikebaum et al. (arXiv: 1608.06273v1 [physics.ins-det], Aug. 22, 2016).

Figure 9A:
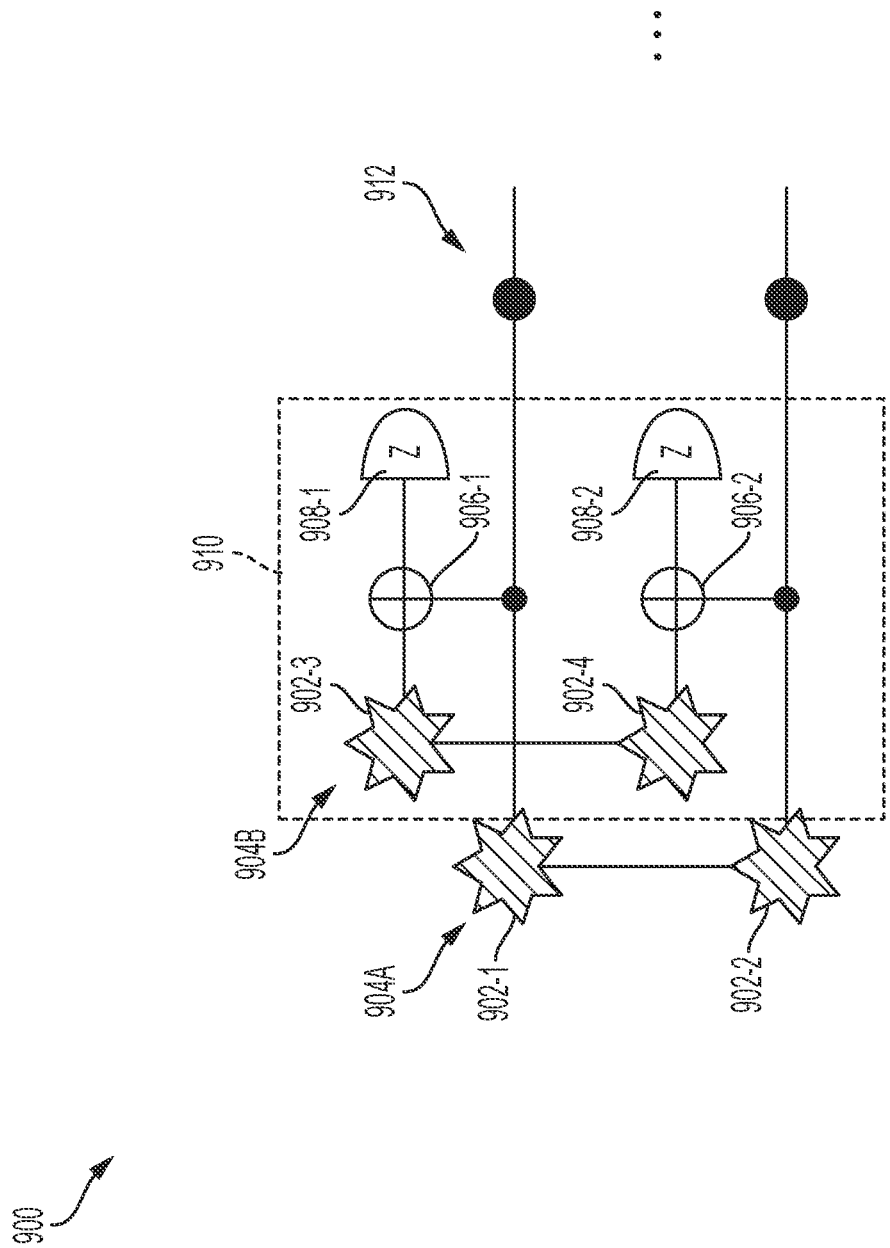
FIG. 9A is a schematic diagram showing an example quantum logic circuit for quantum entanglement distillation.

In some instances, the over-coupling of the transducer device (e.g., $\kappa_{m,e} >> \kappa_{m,i}$, where $\kappa_{m,i}$ and $\kappa_{m,e}$ represent the intrinsic and extrinsic coupling rates, respectively; and m refers to the microwave mode. And using low-loss superconducting interconnects can reduce the microwave loss $P_{loss}$, between the transducer devices and the qubit devices. In some instances, the large loss rates $\kappa_m \sim 10$ MHz, of the transducer devices can be tuned to optimize the overall efficiency and to facilitate the over-coupling, where $\kappa_m$ is the summation of the intrinsic and extrinsic loss rates $\kappa_{m,i}$ and $\kappa_{m,e}$. In certain examples, the microwave resonator of the transducer device can be actively controlled to shape the microwave photons in the microwave modes for optimal absorption, thereby reducing $P_{loss}$. For example, one or more nonlinear superconducting elements can be integrated with the transducer device to achieve tunability of the microwave resonator. In some cases, the photodetector devices include superconducting nanowire single photon detectors with low dark count rates (e.g., <10 Hz), which can be used to reduce the false heralding rate ($P_{faulse}$). In some instances, active stabilization of the optical path length of the interferometer device (e.g., the interferometer device 540 in FIG. 5) or persistent calibration can be used to reduce the probability of phase errors ($P_{phase}$) FIG. 9A is a schematic diagram showing an example quantum logic circuit 900 for quantum entanglement distillation. The example quantum logic circuit 900 shown in FIG. 9A represents a portion of a single-selection quantum entanglement distillation protocol that is used to improve fidelity of entangled states. The quantum entanglement distillation protocol is mapped onto logical qubits. In some implementations, quantum entanglement distillation is a probabilistic process which purifies a raw Bell pair of entangled states using multiple raw Bell pairs into one single Bell pair with an increased fidelity at a success probability of $p_d$. Quantum entanglement distillation is used in order to achieve a desired fidelity. In some instances, the quantum entanglement distillation protocol shown in FIG. 9A can be used to boost a fidelity of entangled states from an initial value of 0.82 to 0.96 with a success probability $p_d$ of greater than 65% for each link.

As shown in FIG. 9A, each of the two raw Bell pairs 904A, 904B includes a pair of entangled microwave states, which are generated with respect to the operations in the example process 600 in FIG. 6 and using the example quantum computing network 500 in FIG. 5 or in another manner. Particularly, a first raw Bell pair 904A is applied on two logical qubits 902-1, 902-2; and a second raw Bell pair 904B is applied on two logical qubits 902-3, 902-4. In some implementations, the logical qubits 902-1 and 902-3 are in one quantum processor module; and the logical qubits 902-2 and 902-4 are in a distinct quantum processor module. In some instances, the logical qubits 902-1, 902-2, 902-3, 902-4 may be defined on different quantum processor modules or in another manner.

The example quantum logic circuit 900 for single-selection quantum entanglement distillation shows one round 910 of quantum entanglement distillation. As shown in FIG. 9A, a round 910 of quantum entanglement distillation includes two CNOT gates 906 and two Z measurements 908. An example process for achieving quantum entanglement distillation using the quantum logic circuit shown in FIG. 9A is described in the publication entitled "Optimized Entanglement Purification", by S. Krastanov, et al. (arXiv: 1712.09762v3 Feb. 14, 2019).

In some implementations, the first raw Bell pair 904A can be distilled using the second raw Bell pair 904B to generate a distilled Bell pair 912 of entangled microwave states with an increased fidelity, with success heralded by the outcome of the measured qubits in the Z basis. In some implementations, this protocol can be run recursively to further boost fidelity of the distilled Bell pair towards a desired amount, where a previously distilled Bell pair from a preceding round can be further distilled by another raw Bell pair in a later round. For example, fidelity of the Bell pair 912 distilled from the first and second raw Bell pairs 904A, 904B can be further increased using a third raw Bell pair or another distilled Bell pair.

Figure 9B:
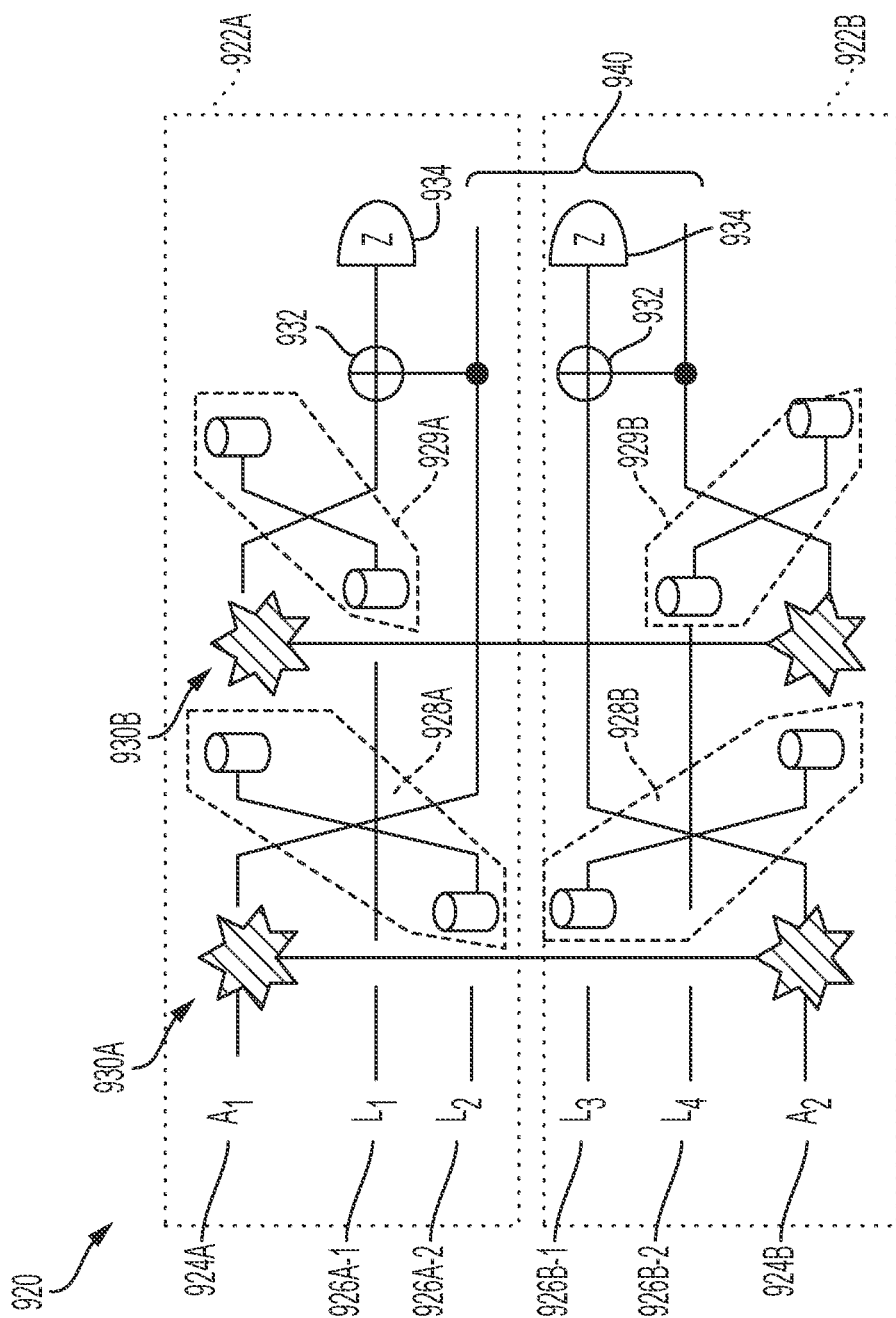
FIG. 9B is a schematic diagram showing an example quantum logic circuit for quantum entanglement distillation.

FIG. 9B is a schematic diagram showing an example quantum logic circuit 920 for quantum entanglement distillation. The example quantum logic circuit 920 shown in FIG. 9B represents a portion of a single-selection quantum entanglement distillation protocol that is used to improve fidelity of entangled states. The quantum entanglement distillation protocol is mapped onto logical qubits.

As shown in FIG. 9B, each of two raw Bell pairs 904A, 904B includes a pair of entangled microwave states, which is generated with respect to the operations in the example process 600 in FIG. 6 and using the example quantum computing network 500 in FIG. 5 or in another manner. A first raw Bell pair 930A is generated and applied on two qubits defined by two ancilla qubit devices 924A, 924B. The qubits defined by the two ancilla qubit devices 924A, 924B are swapped with qubits defined by two respective data qubit devices of a patch of surface code in the same quantum processing units. In particular, the qubit of the ancilla qubit device 924A is swapped with the qubit of a first data qubit device in the first quantum processing unit 922A; and the qubit of the ancilla qubit device 924B is swapped with the qubit of a first data qubit device in the second quantum processing unit 922B. After the swapping operations, the first raw Bell pair 930A is applied on the two data qubit devices of the respective quantum processing units. In some implementations, a GHZ state spanning the array distance (here taking initial distance d=3) is generated with each of the data qubit devices 926A-2 and 926B-1. All local stabilizer measurement qubit devices (e.g., the local stabilizer measurement qubit devices 1014 in FIG. 10A) of a quantum processing unit are measured in a round of surface code to produce logical qubits 926A-2 and 926B-1. In some implementations, the patch of surface code is expanded to a higher distance (e.g., d>3), which is chosen to sustain memory for the time-duration required to execute a desired distillation strategy. Examples of a logical qubit encoding operation are described in the publication entitled "Surface Code Quantum Computing by Lattice Surgery" by C. Horsman et al. (New Journal of Physics 14 (2012) 123011 (27pp), Dec. 7, 2012). In some implementations, after performing the swapping operations, the first raw Bell pair 930A is applied on the two logical qubits 926A-2 and 926B-1 of the respective quantum processing units 922A, 922B.

In some implementations, the logical qubit encoding operation is repeated with a separate patch of data qubit devices (e.g., a separate quantum processor module in a modular quantum processing unit, or a different subset of qubit devices in a quantum processing unit) to produce multiple pairs of remotely entangled logical qubits. As shown in FIG. 9B, a second raw Bell pair 930B is generated and further applied on the two qubits defined by the two ancilla qubit devices 924A, 924B. The qubits defined by the two ancilla qubit devices 924A, 924B are swapped with qubits defined by two different data qubit devices in the same quantum processing units 922. In particular, the qubit of the ancilla qubit device 924A is swapped with the qubit of a second data qubit device in the first quantum processing unit 922A; and the qubit of the ancilla qubit device 924B is swapped with the qubit of a second data qubit device in the second quantum processing unit 922B. After performing the third and fourth logical qubit encoding operations 929A, 929B, the second raw Bell pair 930B is applied on the two logical qubits 926A-1 and 926B-2.

In some implementations, quantum operations that are implemented in a fault-tolerant manner with the surface code can be performed to distill the raw Bell pairs. As shown in FIG. 9B, logical CNOT gates 932 and logical qubit measurements 934 within the quantum processing units 922A, 922B are performed. In some instances, other quantum logic operations including H gates, X basis measurement can be performed to obtain a distilled Bell pair.

Examples of surface codes are described in the publication entitled "Surface codes: Towards practical large-scale quantum computations" by A. Fowler et al. (arXiv:1208.0928v2 [quant-ph], Oct. 27, 2012).

In some implementations, a distilled Bell state can be used to orchestrate distributed computation. For example, distilled Bell states with increased fidelity can be consumed to perform multi-qubit parity measurements. Examples of multi-qubit parity measurements are described in the publication entitled "Surface codes quantum communication" by A. Fowler et al. (arXiv:0910.4074v3 [quant-ph], Feb. 5, 2010). In some implementations, a logical qubit state can be teleported from one quantum processing unit in a quantum computing system to another in a remote, distinct quantum computing system.

To determine a suitable configuration of superconducting qubit devices within a quantum processor module for the purposes of deploying the above protocol, we consider the estimated parameters of a single transducer device as outlined above as well as multiplexing factors assumed to provide fully parallel attempts at remote entanglement. Taking into account the simulated power dissipation of 2 $\mu$W per transducer device and reasonable cooling powers in a dilution system at suitable temperatures for the functioning optical mechanism (e.g., 1 mW at 100 mK); upwards of M=500 individual elements are anticipated to be available within a single quantum processing unit or a single processor module of a quantum processing unit for networking purposes, where M is a multiplexing factor, resulting in a total quantum entanglement generation rate of 2 MHz (e.g., R=M×r=2 MHz) for a quantum entanglement generation rate of an individual element of 4 kHz (e.g., r=4 kHz). In some implementations, each individual element include a transducer device and an associated qubit device.

In some implementations, to determine the size of individual logical qubits (e.g., code distance d) required within the quantum entanglement distillation protocol as described in FIG. 9B, a number of raw Bell pairs required, initial fidelity of each of the raw Bell pairs, and a final fidelity can be estimated. For a target remote operation of logical qubit teleportation, a number of raw Bell pairs that scales as $D^2$ for D the distance of the main processor surface code patches, since there are 2D parity measurements that are repeated D times to correct for measurement errors to achieve the logical distance of the main processor. Assuming a physical error rate of $p_{rate}=10^{-3}$ (corresponding to the error associated with gates between the processor qubits) and considering standard fault-tolerant applications, such as Shor's algorithm, a distance of the main processor surface code patches of D=27 is expected to suffice for acceptable execution success criteria. Therefore, assuming the raw Bell pairs have high fidelity >92-96%, the time to produce the raw Bell pairs without distillation is approximately one millisecond (1 ms). Thus, coherence times exceeding 10 ms would be necessary to maintain these entangled microwave states with high fidelity, which is orders of magnitude beyond the reach of superconducting qubit devices.

In some instances, a smaller intermediate logical qubit with a code distance d can be used for storing each state in a raw Bell pair. Assuming a physical error rate of $p_{rate}=10^{-3}$ and using a threshold error for planar surface code of $p_{th}=0.57\%$, storing a state for 10 ms can be achieved with a logical suppression $P_L \approx 0.03(p_{gate}/p_{th})^{de}$, where the effective error suppression de=$\lfloor(d+1)/2\rfloor$. Examples of surface codes are described in the publication entitled "Surface codes: Towards practical large-scale quantum computations" by A. Fowler et al. (arXiv:1208.0928v2 [quant-ph], Oct. 27, 2012). In some instances, a code distance of d=7, which corresponds to approximately 200 physical qubit devices per stored state, can reduce memory errors by a significant factor. In this case, in order to store all the required raw Bell pairs for fault-tolerant lattice surgery at a distance D can require a cache memory of approximately $C=3\times10^5$ physical qubit devices and ancilla qubit devices for data movement. The size of the cache memory is equivalent to about 10 logical qubits on a quantum processing unit with D=27. In some implementations, the size of the cache memory of $C=3\times10^5$ represents an upper bound, since these entangled states are consumed in a round-by-round fashion and not consumed instantaneously. In some implementations, when entangled states are consumed in a round-by-round fashion, the raw Bell pairs that are used for one round of stabilizer measurements are pre-fetched, which results in a reduced cache memory size. For example, at a code distance of d=7, the cache memory size is $C=2D\times(2d)^2=10^4$. For another example, in order to tolerate some memory degradation, at a code distance of d=5, the cache memory size is $C=5\times10^3$. In some implementations, adding quantum entanglement distillation into these physical requirements scales as the width of the distillation quantum logic circuit (e.g., as shown in FIGS. 9A-9B). For a networking error threshold anticipated at 10% due to the error syndrome decoding graphs requiring a topology having dimension being only 2 (e.g., errors occur only on the one physical on the boundary, tracked over one time dimension), two rounds of single-selection quantum entanglement distillation operation can be used for an improved or optimized setup.

FIG. 10A is a block diagram showing aspects of an example quantum computing network 1000. The example quantum computing network 1000 includes multiple quantum computing systems and each of the quantum computing systems includes a quantum processing unit. In some instances, the quantum processing unit can be a modular quantum processing unit including multiple quantum processor modules. As shown in FIG. 10A, two of the multiple quantum processor modules are shown, e.g., a first quantum processor module 1002A and a second quantum processor module 1002B. The first and second quantum processor module 1002A, 1002B are from two distinct modular quantum processing units of two distinct, remote quantum computing systems. Quantum entanglements between two respective qubit devices in the two respective quantum processor modules 1002A, 1002B can be created according to operations with respect to the example process 600 described in FIG. 6 using the example quantum computing network 500 in FIG. 5 or in another manner. Performing quantum entanglement distillation over many qubit devices, instead of logical qubits is another way to purify raw Bell pairs of entangled qubits. In some implementations, a lattice surgery can be performed via remote quantum entanglement using multiple qubit devices.

As shown in FIG. 10A, each of the first and second quantum processor modules 1002A, 1002B includes a superconducting quantum circuit with multiple qubit devices. In some instances, each of the first and second quantum processor modules 1002A, 1002B includes other quantum circuit devices (e.g., coupler devices, connections, and control signal lines). Square tiles in FIG. 10A represent different patterns of parity checks, for instance ZZZZ (tiles in light gray) or XXXX (tiles in dark gray) parity checks in the case of the standard surface code. In particular, the first quantum processor module 1002A includes ZZZZ parity checks 1008A-1 and XXXX parity checks 1008A-2; and the second quantum processor module 1002B includes ZZZZ parity checks 1008B-1 and XXXX parity checks 1008B-2. Each of the parity checks includes a parity check qubit device at the center of a tile connected to four data qubit devices at the corners of the same tile. The parity check qubit device is coupled to the data qubit devices via intra-chip connections. Couplings provided by intra-chip connections within a tile can be used to apply multi-qubit quantum logic gates or other types of operations to qubits within a quantum processor module. Quantum logic gates mediated by intra-chip connections can be used to create quantum entanglement between qubits defined by qubit devices within a quantum processor module. In some instances, the intra-chip connections may include circuit elements such as static capacitive coupling elements or tunable coupler devices, that support two-qubit/qudit quantum logic gates. The square tiles in the same color (dark or light gray) represent the prescribed pattern of quantum logic gates.

The first quantum processor module 1002A further includes five boundary data qubit devices 1016A-1, 1016A-2, 1016A-3, 1016A-4, and 1016A-5 (labeled as "unfilled" circles in FIG. 10A), and four local stabilizer measurement qubit devices 1014A-1, 1014A-2, 1015A-1, and 1015A-2 (labeled as "filled" circles in FIG. 10A). The second quantum processor module 1002B includes five boundary data qubit devices 1016B-1, 1016B-2, 1016B-3, 1016B-4, and 1016B-5, and four local stabilizer measurement qubit devices 1014B-1, 1014B-2, 1015B-1, and 1015B-2. The local stabilizer measurement qubit devices 1014A-1, 1014A-2 are X parity checks qubit device; and the local stabilizer measurement qubit devices 1015A-1, 1015A-2 are Z parity checks qubit devices. Similarly, the local stabilizer measurement qubit devices 1014B-1, 1014B-2 are X parity checks qubit device; and the local stabilizer measurement qubit devices 1015B-1, 1015B-2 are Z parity checks qubit devices.

As shown in FIG. 10A, each of the local stabilizer measurement qubit devices 1014A/1014B, 1015A/1015B on a quantum processor module 1002A/1002B is communicably coupled to two neighboring boundary data qubit devices 1016A/1016B on the same quantum processor module 1002A/1002B via intra-chip connections 1010. Each of the local stabilizer measurement qubit devices 1014A, 1015A on the first quantum processor module 1002A is communicably coupled to respective local stabilizer measurement qubit devices 1014B, 1015B on the second quantum processor module 1002B via respective links 1018. Specifically, the X parity check qubit devices 1014A-1 of the first quantum processor module 1002A is communicably coupled to the X parity check qubit devices 1014B-1 of the second quantum processor module 1002B via a first link 1018-1; the Z parity check qubit devices 1015A-1 of the first quantum processor module 1002A is communicably coupled to the Z parity check qubit devices 1015B-1 of the second quantum processor module 1002B via a second link 1018-2; the X parity check qubit devices 1014A-2 of the first quantum processor module 1002A is communicably coupled to the X parity check qubit devices 1014B-2 of the second quantum processor module 1002B via a third link 1018-3; and the Z parity check qubit devices 1015A-2 of the first quantum processor module 1002A is communicably coupled to the Z parity check qubit devices 1015B-2 of the second quantum processor module 1002B via a fourth link 1018-4.

As shown in FIG. 10A, the links 1018-1, 1018-2, 1018-3, and 1018-4 (labeled in dotted lines) represent quantum entanglement between qubit devices that reside on different quantum processor modules. In some instances, each link 1018 may include a global controller system 508A, 508B, two transducer devices 522A, 522B, pump filters 524A, 524B, and a portion of the superconducting quantum circuit 526A, 526B as shown in the example quantum computing network 500 in FIG. 5. Each pair of the parity check qubit devices that are coupled through a respective link 1018 are prepared in a raw Bell pair. In some implementations, a lattice merge operation is achieved by performing a ZZZZ parity measurement 1020 and a XXXX parity measurement 1040, each of which can consume a remote Bell pair.

FIGS. 10B-10C are schematic diagrams showing aspects of example quantum logic circuits 1120, 1140 for performing a ZZZZ parity measurement and a XXXX parity measurement with a remote Bell pair of entangled qubits.

As shown in FIG. 10B, the remote Bell pair of entangled states 1022 are generated and transmitted to the local stabilizer measurement qubit device 1014A-1 of the first quantum processor module 1002A and the local stabilizer measurement qubit device 1014B-1 of the second quantum processor module 1002B. Two CNOT gates 1024 are applied between the local stabilizer measurement qubit device 1014A-1 and two respective data qubit devices 1016A-1, 1016A-2. A Z-basis measurement 1026 is performed on the local stabilizer measurement qubit device 1014A-1. Similarly, two CNOT gates 1024 are applied between the local stabilizer measurement qubit device 1014B-1 and two respective data qubit devices 1016B-1, 1016B-2. A Z-basis measurement 1026 is performed on the local stabilizer measurement qubit device 1014B-1.

As shown in FIG. 10C, the remote Bell pair of entangled states 1042 are generated and transmitted to the local stabilizer measurement qubit device 1015A-2 of the first quantum processor module 1002A and the local stabilizer measurement qubit device 1015B-2 of the second quantum processor module 1002B. Two Hadamard gates 1044 are applied on the local stabilizer measurement qubit devices 1015A-2, 1015B-2. Two CNOT gates 1046 are applied between the local stabilizer measurement qubit device 1015A-2 and two respective data qubit devices 1016A-4, 1016A-5. A X-basis measurement 1048 is performed on the local stabilizer measurement qubit device 1015A-2. Similarly, two CNOT gates 1046 are applied between the local stabilizer measurement qubit device 1015B-2 and two respective data qubit devices 1016B-4, 1016B-5. A X-basis measurement 1048 is performed on the local stabilizer measurement qubit device 1015B-2. In some implementation, the lattice merge operation described here allows for obtaining the requisite stabilizer measurement. In some instances, the lattice merge operation can be used to replace the CNOT gates 906 and Z measurements 908 as described in FIG. 9A, for example.

Figure 11:
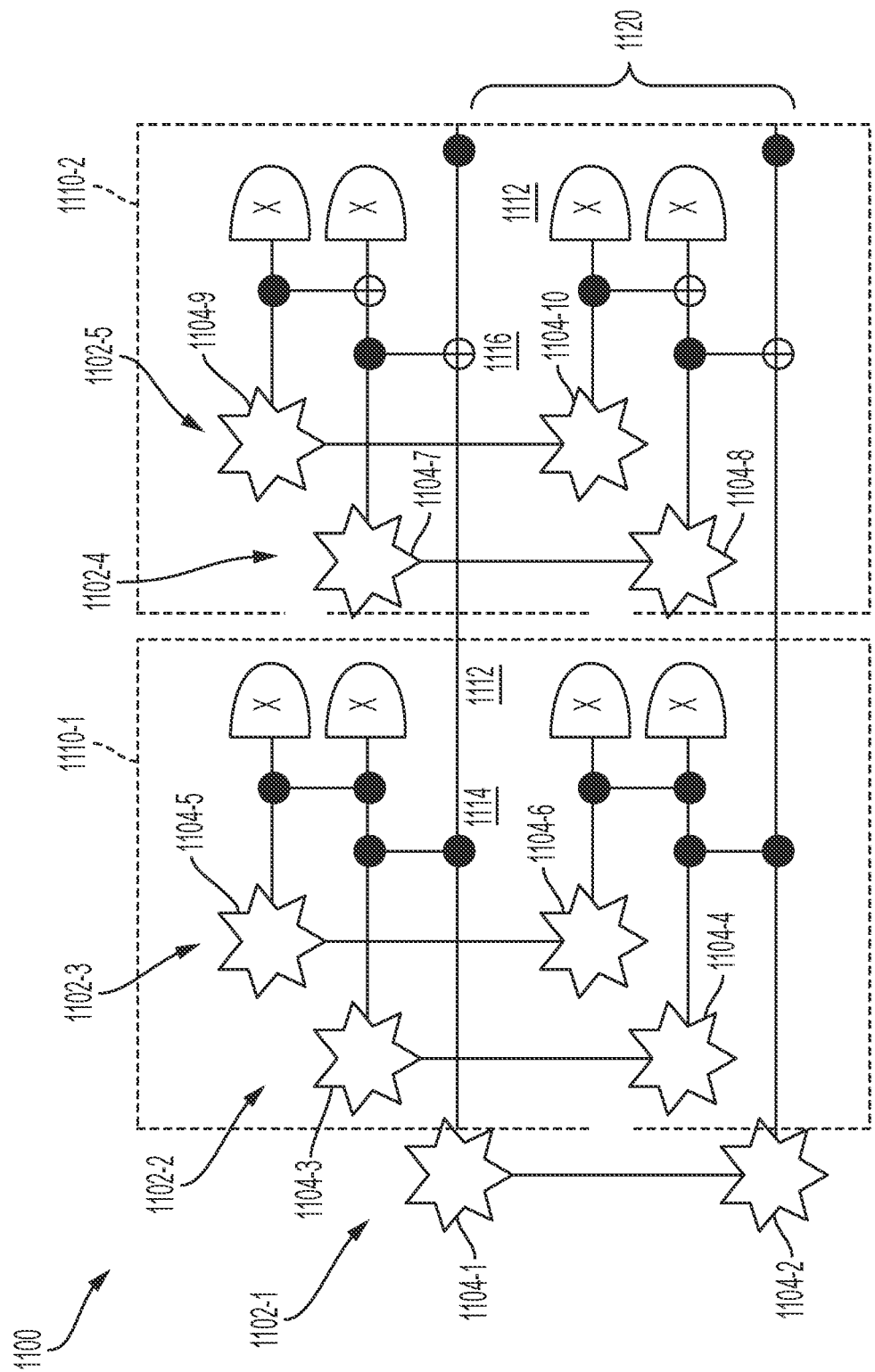
FIG. 11 is a schematic diagram showing aspects of an example quantum logic circuit for quantum entanglement distillation.

FIG. 11 is a schematic diagram showing aspects of an example quantum logic circuit 1100 for quantum entanglement distillation. The example quantum logic circuit 1100 shown in FIG. 11 represents a portion of a double-selection quantum entanglement distillation protocol that is used to improve fidelity of entangled qubits. The quantum entanglement distillation protocol shown in FIG. 11 is mapped onto physical qubit devices.

In some implementations, a first Bell pair of entangled qubits 1102-1 transmitted to qubit devices 1104-1 and 1104-2 is distilled using four additional remotely prepared Bell pairs (e.g., a second Bell pair of entangled qubits 1102-2, a third Bell pair of entangled qubits 1102-3, a fourth Bell pair of entangled states 1102-4, and a fifth Bell air of entangled states 1102-5). In some implementations, all five Bell pairs of entangled states are prepared with respect to the operations in the example process 600 using the quantum computing network 500 in FIG. 5. In some implementations, assuming each of the five Bell pairs has input raw fidelity of F=0.82, a finite probability of protocol success in achieving distillation $p_d$=76%.

As shown in FIG. 11, the example quantum logic circuit 1100 for double-selection quantum entanglement distillation shows two rounds of double-selection quantum entanglement distillation operations 1110-1, 1110-2. In some implementations, the quantum logic circuit representing a first round of double-selection quantum entanglement distillation operation 1110-1 includes four controlled-Z gates 1114, and four X-basis measurements 1112. Similarly, the quantum logic circuit representing a second round of double-selection quantum entanglement distillation 1110-2 includes four controlled-X gates 1116 and four X-basis measurements 1112. In some instances, outcomes of the example quantum logic circuits 1100 can be sampled to determine the success probability for the input raw fidelity.

Figure 12:
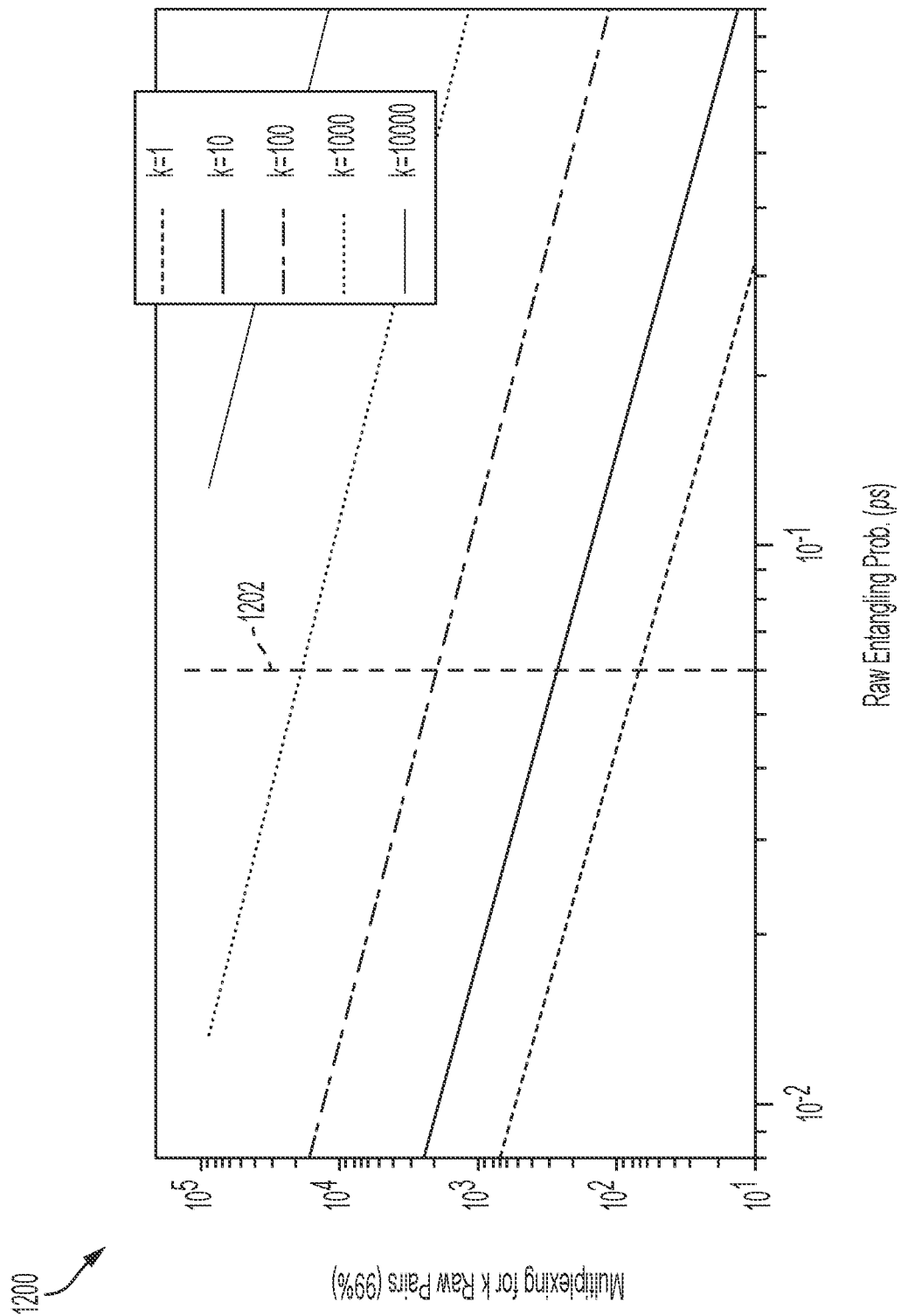
FIG. 12 is a log-log plot 1200 of a total number of links (e.g., a multiplexing factor m) as a function of raw entangling probability ($p_s$) of a single link at various numbers (k) of raw Bell pairs of entangled qubits.

In the example presented here, the quantum logic circuit 1100 is expressed using a wire diagram as shown in FIG. 11. In certain instances, a quantum logic circuit may be described in another manner, for example, by a quantum instruction program, equivalently via tensor-network representation. When a quantum logic circuit is expressed using a quantum instruction program, the example quantum logic circuit 1100 can be expressed using the following Quil program adapted for Z-basis measurements:

Def make_doubleesel_prog( ):
prog=Programs( )
ro=prog.declare('ro', memory_type='BIT', memory_size=10)
for k in range(3):
make wener(2*k, *k+1, prog. Raw_fid)
for k in range(4):
prog+=CNOT(k+2,k)
prog+=[MEASURE(k, ro[i]) for i in [2, 3, 4, 5]]
for k in [3, 4]:
make werner(2*k, 2*k+1, prog, raw_fid)
for k in [6, 8]:
prog+=H(k)
prog+=CNOT(0,k)
prog+=H(k)
for k in [7,9]:
prog+=H(k)
prog+=CNOT(0,k)
prog+=H(k)
prog+=[MEASURE(, ro(i)) for i in [6, 7, 8, 9]]
return prog FIG. 12 is a log-log plot 1200 of a total number of links (e.g., a multiplexing factor m) as a function of raw entangling probability ($p_s$) of a single link at various numbers (k) of raw Bell pairs of entangled qubits. The total number of raw Bell pairs of entangled qubits used in a numerical study includes k=1, 10, 100, 1000, and 10000. The plot 1200 in FIG. 12 shows a total number of links that are needed to allow a generation of k raw Bell pairs of entangled qubits with high reliability ($p_r$=99%). In some implementations, the total numbers of raw Bell pairs of entangled qubits are generated with respect to the operations of the example process 600 in FIG. 6 using the example quantum computing network 500 in FIG. 5.

As shown in FIG. 12, the dashed line 1202 represents a constant raw entangling probability ($p_s$) of 0.06 which can be reasonably obtained using a single link based on lithium niobate based electro-optic transducer devices in an example quantum computing network (e.g., the transducer devices 522A, 522B of the example quantum computing network

500 in FIG. 5). As shown in FIG. 12, in order to achieve a total number of raw Bell pairs of k=1000 and each individual link has a constant raw entanglement probability of $p_s$=0.06, a multiplexing factor of m=20000 (e.g., a total number of 20000 links) is required.

In some implementations, to perform one round of stabilizer measurements during lattice surgery, q distilled Bell pairs and at least 5q raw Bell pairs are required. Assuming the probability of reaching the 5q raw Bell pairs is $p_r$, since each quantum entanglement generation (e.g., raw Bell pair generation) event is a Bernoulli trial, the probability of realizing k links from m trials is a binomial distribution ($p_k$) is:

$$p_k = \binom{m}{k}(p_s)^k(1-p_s)^{m-k}. \qquad (4)$$

In some implementations, in order to obtain a sufficient number of raw Bell pairs for distillation, we need at least k=5q links, which means that $$p_r = \sum_{k=5q}^{m} p_k \qquad (5)$$

where $P_r$ is the probability of reaching the 5q raw Bell pairs; m represents a total multiplexing factor, meaning that for n physical channels with c trials, m=nc. In some implementations, a link is a successful trial (e.g., a raw Bell pair) established across two physical channels, each of which includes a transducer device. This can be sustained with auxiliary qubit devices for distillation and re-use of the physical channels independent of prior success. The number of trials c that can be attempted in a single quantum entanglement distillation operation is limited by the finite coherence of the superconducting qubit devices. Assuming $T_2$=350 µs, an attempt rate of R=1 MHz, about c=80 trials can be made before the incoherent memory error becomes comparable to the target distillation level. In some implementations, the logical clock rate requirement of 150 quantum bit per second (qb/s) for data movement, it is necessary to reduce the number of trials through physical multiplexing as much as possible. In some instances, the number of attempts can be limited by the cooling power at low temperatures. In some instances, most of a transducer device is thermalized at 100 mK; and a dilution refrigerator at this stage (e.g., 100 mK) can achieve a cooling power of 3 mW. Assuming an average dissipation of 2.5 µW per transducer device and the entire cooling power of a dilution refrigerator at this stage is dedicated to the active heat load of the transducer devices, a total number of n<1200 physical channels is required.

In some instances, the number of physical channels is n=1200, and the number of trials c=17 may be used for minimizing latency. In certain instances, the number of physical channels n=250, and the number of trials c=80 may be used for minimizing power dissipation. In some implementations, frequency domain multiplexing is used to achieve additional efficiencies at a greater number of physical channels (n), and thus faster clock speeds are possible. In this case, multiple transducers of respective physical channels operate at respective distinct frequencies. These correspond to remote-mediated stabilizer rounds occurring at rates of $R_d$=1 MHz per trial, which need to be repeated d times for fault-tolerance, that is R=d×R/c, where d is the code space, R is the quantum entanglement generation rate, and c is the number of trials. In some instances, a logical qubit teleportation clock rate of about 300 qb/s (c=17) can be multiplexing limited, and a logical qubit teleportation clock rate of about 62 qb/s (c=80) can be coherence-time limited. In certain instances, the parameters may have other values according to the types of applications.

In a general aspect, a photonic quantum networking for large superconducting qubit modules is disclosed.

In a first example, quantum entanglement between a first qubit device of a first quantum processing unit (QPU) and a second qubit device of a second QPU is generated. Microwave modes and optical modes are generated on the first and second QPUs by operation of a first transducer device of the first QPU and a second transducer device of the second QPU. The microwave modes are transmitted within the first and second QPUs from the first and second transducer devices to the respective first and second qubit devices. The optical modes are transmitted from the first and second QPUs to an interferometer device. By operation of the interferometer device, output signals are generated on respective output channels based on the optical modes from the first and second QPUs. The output signals are detected by operation of photodetector devices coupled to the respective output channels of the interferometer device. Based on the output signals, identifying the quantum entanglement transferred to the first and second qubit devices by the microwave modes.

Implementations of the first example may include one or more of the following features. When the microwave modes and optical modes are generated on the first and second QPUs, microwave modes and optical modes are generated by operation of the first transducer device in response to first optical excitations; and microwave modes and optical modes are generated by operation of the second transducer device in response to second optical excitations. The first and second optical excitations are generated by operation of a pump laser system and a beam splitter device; and the first and second optical excitations are transmitted from the beam splitter device to the respective first and second QPUs. The first QPU includes a first pump filter that filters at least a portion of the first optical excitations, and the second QPU includes a second pump filter that filters at least a portion of the second optical excitations. Each of the first and second pump filters includes two optical ring resonators coupled in series. Each of the first and second pump filters includes a sequence of optical ring resonators coupled in parallel.

Implementations of the first example may include one or more of the following features. Each of the first and second transducer devices is a direct electro-optic transducer device comprising a lithium niobate thin film. Each of the first and second transducer devices includes a first optical ring resonator, a second optical ring resonator, a superconducting microwave resonator configured to modulate a resonant frequency of the first optical ring, and a tuning capacitor configured to apply DC bias to the second optical ring resonator. The microwave modes include microwave photons. The superconducting microwave resonator is configured to generate the quantum entanglement. Each of the first and second QPUs includes a microwave transmission line capacitively coupled to the respective first and second transducer devices, a Purcell filter, and an intermediate resonator. When the microwave modes are transmitted within the first and second QPUs, the microwave photons are transmitted on the microwave transmission lines; the microwave photons are filtered by operation of the Purcell filters; and coherence of the microwave photons are maintained by operation of the intermediate resonator.

Implementations of the first example may include one or more of the following features. Each of the first and second qubit devices is a tunable transmon qubit device. When each of the first and second QPUs includes a plurality of qubit devices that collectively defines one or more logical qubits, the quantum entanglement is distilled by operation of the one or more logical qubits. When each of the first and second QPUs includes a plurality of qubit devices, the quantum entanglement is distilled by operation of the plurality of qubit devices.

In a second example, a quantum computing network includes a plurality of quantum processing units (QPUs) and a global controller system. Each of the plurality of QPUs includes a qubit device and a transducer device. The plurality of QPUs includes a first QPU and a second QPU. The first QPU includes a first qubit device and a first transducer device; and the second QPU includes a second qubit device and a second transducer device. Each of the plurality of QPUs is configured to perform operations including generating microwave modes and optical modes by operation of the transducer device; transmitting the microwave modes within the QPU from the transducer device to qubit device; and transmitting the optical modes from the QPU to an interferometer device. The global controller system includes the interferometer device and photodetector devices. The global controller is configured to perform operations including: by operation of the interferometer device, generating output signals on respective output channels based on the optical modes from the first and second QPUs; detecting the output signals by operation of the photodetector devices coupled to the respective output channels of the interferometer device; and based on the output signals, identifying quantum entanglement transferred to the first and second qubit devices by the microwave modes.

Implementations of the second example may include one or more of the following features. When the microwave modes and optical modes are generated on the first and second QPUs, microwave modes and optical modes are generated by operation of the first transducer device in response to first optical excitations; and microwave modes and optical modes are generated by operation of the second transducer device in response to second optical excitations. The global controller system further includes a pump laser system and a beam splitter device. The global controller system is configured to perform operations including: generating the first and second optical excitations by operation of the pump laser system and the beam splitter device; and transmitting the first and second optical excitations from the beam splitter device to the respective first and second QPUs. The first QPU includes a first pump filter configured to filter at least a portion of the first optical excitations; and the second QPU includes a second pump filter configured to filter at least a portion of the second optical excitations. Each of the first and second pump filters includes two optical ring resonators coupled in series. Each of the first and second pump filters includes a sequence of optical ring resonators coupled in parallel.

Implementations of the second example may include one or more of the following features. Each of the first and second transducer devices is a direct electro-optic transducer device comprising a lithium niobate thin film. Each of the first and second transducer devices includes a first optical ring resonator, a second optical ring resonator, a superconducting microwave resonator configured to modulate a resonant frequency of the first optical ring, and a tuning capacitor configured to apply DC bias to the second optical ring resonator. The microwave modes include microwave photons. The superconducting microwave resonator is configured to generate the quantum entanglement. Each of the first and second QPUs includes a microwave transmission line capacitively coupled to the respective first and second transducer devices, a Purcell filter, and an intermediate resonator. When the microwave modes are transmitted within the first and second QPUs, the microwave photons are transmitted on the microwave transmission lines; the microwave photons are filtered by operation of the Purcell filters; and coherence of the microwave photons is maintained by operation of the intermediate resonator.

Implementations of the second example may include one or more of the following features. Each of the first and second qubit devices is a tunable transmon qubit device. Each of the first and second QPUs includes a plurality of qubit devices that collectively defines one or more logical qubits. Each of the first and second QPUs is configured to perform operations including: distilling, by operation of the one or more logical qubits, the quantum entanglement. Each of the first and second QPUs includes a plurality of qubit devices. Each of the first and second QPUs is configured to perform operations including: distilling, by operation of the plurality of qubit devices, the quantum entanglement.

Some of the operations described in this specification can be implemented as operations performed by a data processing apparatus on data stored on one or more computer-readable storage devices or received from other sources.

The term "data-processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program, or in multiple coordinated files (e.g., files that store one or more modules, sub programs, or portions of code). A computer program can be deployed to be executed on one computer or on multiple computers that are located at one site or distributed across multiple sites and interconnected by a communication network.

Some of the processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application specific integrated circuit).

While this specification contains many details, these should not be understood as limitations on the scope of what may be claimed, but rather as descriptions of features specific to particular examples. Certain features that are described in this specification or shown in the drawings in the context of separate implementations can also be combined. Conversely, various features that are described or shown in the context of a single implementation can also be implemented in multiple implementations separately or in any suitable sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single product or packaged into multiple products.

A number of embodiments have been described. Nevertheless, it will be understood that various modifications can be made. Accordingly, other embodiments are within the scope of the following claims.

What is claimed is:

1. A method of generating quantum entanglement between a first qubit device of a first quantum processing unit (QPU) and a second qubit device of a second QPU, the method comprising:
   generating microwave modes and optical modes on the first and second QPUs by operation of a first transducer device of the first QPU and a second transducer device of the second QPU;
   transmitting the microwave modes within the first and second QPUs from the first and second transducer devices to the respective first and second qubit devices;
   transmitting the optical modes from the first and second QPUs to an interferometer device;
   by operation of the interferometer device, generating output signals on respective output channels based on the optical modes from the first and second QPUs;
   detecting the output signals by operation of photodetector devices coupled to the respective output channels of the interferometer device; and
   based on the output signals, identifying the quantum entanglement transferred to the first and second qubit devices by the microwave modes.

2. The method of claim 1, wherein generating the microwave modes and optical modes on the first and second QPUs comprises:
   generating microwave modes and optical modes by operation of the first transducer device in response to first optical excitations; and
   generating microwave modes and optical modes by operation of the second transducer device in response to second optical excitations.

3. The method of claim 2, comprising:
   generating the first and second optical excitations by operation of a pump laser system and a beam splitter device; and
   transmitting the first and second optical excitations from the beam splitter device to the respective first and second QPUs.

4. The method of claim 3, wherein the first QPU comprises a first pump filter that filters at least a portion of the first optical excitations, and the second QPU comprises a second pump filter that filters at least a portion of the second optical excitations.

5. The method of claim 4, wherein each of the first and second pump filters comprises two optical ring resonators coupled in series.

6. The method of claim 4, wherein each of the first and second pump filters comprises a sequence of optical ring resonators coupled in parallel.

7. The method of claim 1, wherein each of the first and second transducer devices is a direct electro-optic transducer device comprising a lithium niobate thin film, each of the first and second transducer devices comprises a first optical ring resonator, a second optical ring resonator, a superconducting microwave resonator configured to modulate a resonant frequency of the first optical ring resonator, and a tuning capacitor configured to apply DC bias to the second optical ring resonator.

8. The method of claim 7, wherein the microwave modes comprises microwave photons, the superconducting microwave resonator is configured to generate the quantum entanglement, each of the first and second QPUs comprises a microwave transmission line capacitively coupled to the respective first and second transducer devices, a Purcell filter, and an intermediate resonator, and transmitting the microwave modes within the first and second QPUs comprises:
   transmitting the microwave photons on the microwave transmission lines;
   filtering, by operation of the Purcell filters, the microwave photons; and
   maintaining, by operation of the intermediate resonator, coherence of the microwave photons.

9. The method of claim 1, wherein each of the first and second qubit devices is a tunable transmon qubit device.

10. The method of claim 1, wherein each of the first and second QPUs comprises a plurality of qubit devices that collectively defines one or more logical qubits, and the method further comprises:
    distilling, by operation of the one or more logical qubits, entangled states.

11. The method of claim 1, wherein each of the first and second QPUs comprises a plurality of qubit devices, and the method further comprises:
    distilling, by operation of the plurality of qubit devices, entangled states.

12. A quantum computing network comprising:
    a plurality of quantum processing units (QPUs) each comprising a qubit device and a transducer device, the plurality of QPUs comprising:
       a first QPU comprising a first qubit device and a first transducer device;
       a second QPU comprising a second qubit device and a second transducer device;
    wherein each of the plurality of QPUs is configured to perform operations comprising:
       generating microwave modes and optical modes by operation of the transducer device;
       transmitting the microwave modes within the QPU from the transducer device to the qubit device; and
       transmitting the optical modes from the QPU to an interferometer device; and a global controller system comprising the interferometer device and photodetector devices, the global controller configured to perform operations comprising:
  by operation of the interferometer device, generating output signals on respective output channels based on the optical modes from the first and second QPUs;
  detecting the output signals by operation of the photodetector devices coupled to the respective output channels of the interferometer device; and
  based on the output signals, identifying quantum entanglement transferred to the first and second qubit devices by the microwave modes.

13. The quantum computing network of claim 12, wherein generating the microwave modes and optical modes on the first and second QPUs comprises:
  generating microwave modes and optical modes by operation of the first transducer device in response to first optical excitations; and
  generating microwave modes and optical modes by operation of the second transducer device in response to second optical excitations.

14. The quantum computing network of claim 13, wherein the global controller system further comprises a pump laser system and a beam splitter device, and the global controller system is configured to perform operations comprising:
  generating the first and second optical excitations by operation of the pump laser system and the beam splitter device; and
  transmitting the first and second optical excitations from the beam splitter device to the respective first and second QPUs.

15. The quantum computing network of claim 14, wherein the first QPU comprises a first pump filter configured to filter at least a portion of the first optical excitations, and the second QPU comprises a second pump filter configured to filter at least a portion of the second optical excitations.

16. The quantum computing network of claim 15, wherein each of the first and second pump filters comprises two optical ring resonators coupled in series.

17. The quantum computing network of claim 15, wherein each of the first and second pump filters comprises a sequence of optical ring resonators coupled in parallel.

18. The quantum computing network of claim 12, wherein each of the first and second transducer devices is a direct electro-optic transducer device comprising a lithium niobate thin film, each of the first and second transducer devices comprises a first optical ring resonator, a second optical ring resonator, a superconducting microwave resonator configured to modulate a resonant frequency of the first optical ring resonator, and a tuning capacitor configured to apply DC bias to the second optical ring resonator.

19. The quantum computing network of claim 18, wherein the microwave modes comprises microwave photons, the superconducting microwave resonator is configured to generate the quantum entanglement, each of the first and second QPUs comprises a microwave transmission line capacitively coupled to the respective first and second transducer devices, a Purcell filter, and an intermediate resonator, and transmitting the microwave modes within the first and second QPUs comprises:
  transmitting the microwave photons on the microwave transmission lines;
  filtering, by operation of the Purcell filters, the microwave photons; and
  maintaining, by operation of the intermediate resonator, coherence of the microwave photons.

20. The quantum computing network of claim 12, wherein each of the first and second qubit devices is a tunable transmon qubit device.

21. The quantum computing network of claim 12, wherein each of the first and second QPUs comprises a plurality of qubit devices that collectively defines one or more logical qubits, and each of the QPUs is configured to perform operations comprising:
  distilling, by operation of the one or more logical qubits, entangled states.

22. The quantum computing network of claim 12, wherein each of the first and second QPUs comprises a plurality of qubit devices, and each of the QPUs is configured to perform operations comprising:
  distilling, by operation of the plurality of qubit devices, entangled states.

* * * * *

UNITED STATES PATENT AND TRADEMARK OFFICE
CERTIFICATE OF CORRECTION

PATENT NO. : 12,204,997 B2
APPLICATION NO. : 17/686906
DATED : January 21, 2025
INVENTOR(S) : Reagor et al.

Page 1 of 1

It is certified that error appears in the above-identified patent and that said Letters Patent is hereby corrected as shown below:

On the Title Page

Page 2, Column 1, Other Publications, Line 46 Delete ""Optimized" and insert -- "Optimized -- therefor Page 2, Column 2, Other Publications, Line 7 Delete "litium" and insert -- lithium -- therefor In the Specification Column 19, Detailed Description, Lines 21-22 Delete "ω=E/h)." and insert -- $\omega = E/\hbar)$. -- therefor Column 19, Detailed Description, Line 60 Delete "escribed" and insert -- described -- therefor Column 26, Detailed Description, Line 46 Delete "Δφ" and insert -- $\Delta\phi$ -- therefor Column 30, Detailed Description, Line 14 After "$N_{filter}=5$)" insert -- . --

Column 32, Detailed Description, Line 10 After "($P_{phase}$)" insert -- . --

Column 34, Detailed Description, Line 46 Delete "$p_{rate}=10^{-3}$" and insert -- $p_{gate} = 10^{-3}$ -- therefor Column 34, Detailed Description, Line 60 Delete "$p_{rate}=10^{-3}$" and insert -- $p_{gate} = 10^{-3}$ -- therefor Signed and Sealed this
Twenty-fifth Day of March, 2025

Coke Morgan Stewart
*Acting Director of the United States Patent and Trademark Office*